US009791309B2

United States Patent
Fenske

(10) Patent No.: US 9,791,309 B2
(45) Date of Patent: Oct. 17, 2017

(54) APPARATUS, SYSTEM, AND METHODS FOR WEIGHING AND POSITIONING WAFERS

(71) Applicant: Microtronic, Inc., Edgartown, MA (US)

(72) Inventor: Reiner G. Fenske, Edgartown, MA (US)

(73) Assignee: Microtronic, Inc., Edgartown, MA (US)

(*) Notice: Subject to any disclaimer, the term of this patent is extended or adjusted under 35 U.S.C. 154(b) by 66 days.

(21) Appl. No.: 14/684,504

(22) Filed: Apr. 13, 2015

(65) Prior Publication Data

US 2015/0219486 A1    Aug. 6, 2015

Related U.S. Application Data

(63) Continuation of application No. 13/436,852, filed on Mar. 31, 2012, now Pat. No. 9,004,838, which is a continuation of application No. 13/436,848, filed on Mar. 31, 2012, now Pat. No. 8,851,816.
(Continued)

(51) Int. Cl.
*G01G 19/00* (2006.01)
*G01G 21/00* (2006.01)
(Continued)

(52) U.S. Cl.
CPC .............. *G01G 19/00* (2013.01); *G01G 21/22* (2013.01); *G01G 21/23* (2013.01); *H01L 21/67288* (2013.01); *H01L 21/67778* (2013.01); *G01G 21/00* (2013.01); *Y10S 414/136* (2013.01); *Y10S 414/137* (2013.01); *Y10S 901/46* (2013.01)

(58) Field of Classification Search
CPC ......... H01L 22/12; H01L 22/20; H01L 22/26; H01L 21/67778; H01L 21/67288; H01L 21/32051; H01L 21/32055; H01L 21/31604; G01G 9/00; G01G 19/00; G01G 21/00; G01G 21/22; G01G 21/23; Y10S 901/46; Y10S 414/136; Y10S 414/137
See application file for complete search history.

(56) References Cited

U.S. PATENT DOCUMENTS 3,874,525 A    4/1975   Hassan et al.
4,621,331 A    11/1986  Iwata
(Continued)

*Primary Examiner* — Randy Gibson
(74) *Attorney, Agent, or Firm* — John M. Hammond; Patent Innovations LLC

(57) ABSTRACT

An apparatus for characterizing a wafer comprising an aligner comprising a chuck for receiving and rotating the wafer, a sensor for detecting the position of the wafer as it is rotated, a first actuator for lowering and raising the wafer vertically, and a second actuator for moving the chuck horizontally; and a weighing scale comprising a weight sensor disposed proximate to the aligner, and a cantilevered arm extending laterally from the weight sensor over the chuck of the aligner, the cantilevered arm having a through hole surrounding the chuck. The chuck is vertically movable relative to the weighing scale from a first position in which the wafer is supported by the chuck to a second position in which the wafer is supported by the cantilevered arm of the weighing scale. A method for characterizing a wafer using the instant apparatus is also disclosed.

5 Claims, 21 Drawing Sheets

Related U.S. Application Data

(60) Provisional application No. 61/472,644, filed on Apr. 7, 2011.

(51) Int. Cl.
| | | |
|---|---|---|
| *H01L 21/67* | (2006.01) | |
| *H01L 21/70* | (2006.01) | |
| *H01L 21/677* | (2006.01) | |
| *G01G 21/22* | (2006.01) | |
| *G01G 21/23* | (2006.01) | |

(56) References Cited

U.S. PATENT DOCUMENTS

| | | |
|---|---|---|
| 4,744,709 A | 5/1988 | Hertel et al. |
| 4,789,294 A | 12/1988 | Sato et al. |
| 4,973,217 A | 11/1990 | Engelbrecht |
| 5,143,164 A | 9/1992 | Nahar |
| 5,321,634 A * | 6/1994 | Obata ............... G01G 9/00 177/25.11 |
| 5,625,170 A | 4/1997 | Poris |
| 6,284,986 B1 | 9/2001 | Dietze et al. |
| 6,286,685 B1 * | 9/2001 | Kononchuk ......... G01B 21/08 209/2 |
| 6,790,376 B1 | 9/2004 | Markle et al. |
| 6,902,647 B2 | 6/2005 | Hasper |
| 7,340,372 B2 | 3/2008 | Wilby |
| 2003/0141572 A1 * | 7/2003 | Wilby ............... G01G 9/00 257/632 |
| 2004/0225399 A1 | 11/2004 | Chen et al. |
| 2006/0095228 A1 * | 5/2006 | Wilby ............... G01G 9/00 702/170 |
| 2010/0228382 A1 | 9/2010 | Chao |

\* cited by examiner

APPARATUS, SYSTEM, AND METHODS FOR WEIGHING AND POSITIONING WAFERS

CROSS-REFERENCE TO RELATED PATENT APPLICATIONS

This application is a continuation of U.S. patent application Ser. No. 13/436,852, filed on Mar. 31, 2012 and issuing as U.S. Pat. No. 9,004,838 on Apr. 14, 2015, which is a continuation of copending U.S. patent application Ser. No. 13/436,848, filed on Mar. 31, 2012 and issued as U.S. Pat. No. 8,851,816 on Oct. 7, 2014, which claims priority from U.S. provisional patent Application No. 61/472,644 filed Apr. 7, 2011, the disclosures of which are incorporated herein by reference.

BACKGROUND

Field of the Invention

Apparatus and methods for characterization of wafers and other objects, such as in the manufacturing of semiconductor wafers.

Description of Related Art

Many micro- and nano-scale products, such as integrated circuit (IC) chips and microelectromechanical systems (MEMS), are made according to well known processes. The starting material for such products is typically a thin substrate wafer, such as a silicon wafer substrate. Key steps in manufacturing ICs and MEMS may include film deposition, photolithographic patterning of features in the film, and processing to remove material and create three-dimensional patterned features on the wafer surface. The film deposition, patterning, and processing steps are repeated with sequences of materials to form the functional features of an IC or MEMS device. Current IC chips now have features of less than 50 nanometers.

The substrate wafers are processed to produce such products in a range of sizes, typically from two inches to twelve inches in diameter. Between the various film deposition, patterning, and processing steps, it is common to perform certain characterization steps for quality control of these steps, and of the overall final product. For example, both before and after a film deposition, the wafer may be imaged and weighed. By comparing the images before and after the film deposition, defects in the film may be identified. The thickness of the film and other physical characteristics of the process steps can be inferred by comparing the weights of the wafer before and after the film deposition.

When imaging a wafer, in order to obtain "before" and "after" images that can be easily compared with each other, the wafer must be aligned relative to a fiduciary mark (such as notch or flat) before image capture by a camera, or other optical device. Wafers in need of characterization are typically delivered to a characterization station in a "cassette," which is a carrying device having multiple closely-spaced slots in which the wafers are disposed.

Referring to FIG. 1, a characterization station 10 may be comprised of a wafer handling robot 12, a wafer aligner 14, and a wafer imager 16, all of which may be disposed upon a base platform 18. The robot 12, aligner 14, and wafer imager 16 may be in communication with and controlled by a computer 20, which may also acquire image data from the wafer imager 16.

To perform the characterization process of imaging a wafer, the wafer 2 is removed from a cassette 22 by the robot arm 13, and disposed upon a chuck (not shown) of the wafer aligner 14. The aligner 14 aligns the wafer 2 by rotating it past an optical sensor (not shown) that is in communication with the computer 20. The center of the wafer 2 is located by the computer based on data from the optical sensor. The chuck of the aligner 14 is temporarily lowered, placing the wafer 2 onto a set of stationary support posts, the aligner chuck is moved so that the center of rotation of the chuck is aligned with the center of the wafer 2, and then the aligner chuck is raised and re-engaged with the wafer 2. Thus any translational and angular placement error by the robot is corrected prior to imaging the wafer 2. The wafer 2 is then rotated to a desired position relative to its notch or flat under the wafer imager 16. The wafer imager 16 may include a separate wafer ID reader, which reads and recognizes a number or other code that is formed at a specific location on the wafer surface. A full image of the wafer is captured, associated with the wafer number, and stored in a memory of the computer 20. The image may be further processed with software. The wafer 2 is then removed from the aligner and returned to its slot in the cassette 22. The characterization process steps of transporting from the cassette 22 to the aligner 14, aligning, code reading, imaging, and returning from the aligner 14 to the cassette 22 are repeated for the remaining wafers in the cassette 22.

Subsequently, the cassette 22 of wafers 2 may be moved to a second characterization station (not shown), which includes a weighing scale, and another robot. Thus the steps required to obtain a weight of the wafer 2 are transporting the wafer from the cassette 22 to the scale, weighing the wafer 2, and returning the wafer 2 from the scale to the cassette 22. Alternatively, the characterization station 10 may be provided with a scale (not shown) that is disposed on the base 18, in which case, the robot 12 may move the wafer 2 from the aligner 14 to the scale, and then from the scale back to the cassette 22. A second dedicated robot (not shown) may be provided to perform the transfers to and/or from the scale.

Regardless of whether the wafer weighing operation is performed at a separate characterization station, or by a scale provided at the station 10, there are problems resulting from operating in this manner. Semiconductor manufacturing and other nanoscale processes are performed in clean rooms. A particle-free environment is maintained to the greatest extent possible in order to minimize defects on the wafers. Generally, the more separate process operations that are performed, the more particulate contaminants will be generated. Additional wafer handling increases the likelihood of defect causing contamination or physical damage to the wafers, resulting in costly yield loss. Additionally, performing the operations of aligning, imaging, and weighing separately slows manufacturing throughput, and requires additional capital equipment and plant floor space, both of which also increase unit product cost.

In addition to the problems of handling the wafers to and from the weighing station 10, there are problems with determining wafer characteristics based on wafer weight. Accurate determination of process results such as film thickness based on weight are subject to influence from many variables. These variables may be properties of the materials, used or environmental factors, such as temperature and humidity. Present state of the art requires that variables be either determined along with the wafer weight or recorded with the wafer weight data. In addition, some of the material properties may not be known with high enough reliability to ensure accurate determinations based on the wafer weight.

What is needed is a single characterization station which can perform all of the wafer characterization operations of aligning, imaging, and weighing in a simple and rapid manner.

Along with wafer imaging, current wafer process control relies on instruments to measure physical properties of the deposited films and features. These instruments are designed to reliably characterize absolute properties at specific points across the wafer. The results are compared with expected values and a quality determination is made. However these measurements require additional instruments and are more time consuming. Furthermore, each physical measurement is dependent upon a high degree of support due to strict calibration and parameter control requirements. A wafer characterization system, algorithms and methods are needed to provide simple ways to achieve process control results without complex computations or apparatus.

SUMMARY

In accordance with the present disclosure, the problem of aligning, weighing, and analysis of a wafer or other similar object at a single characterization station is solved by integrating weight measurement capability with a wafer aligner in a characterization system. A wafer transport system and an image scanner may also be integrated into the system.

In accordance with the present disclosure, there are also provided self-referencing algorithms for identifying wafer process problems. The algorithms may be used in conjunction with the characterization system. The algorithms for analysis of the wafer weight data provide a method to identify wafer process defects without the need for knowledge of the wafer process or materials. The essential concept for the wafer weight analysis algorithm processes the difference in wafer weight from before the process step to the difference in weight following the process step. This change in weight is then compared to the change in weight for a different wafer in the lot that has been processed with same process. Additionally, the algorithms may make use of the weight change data as a "fingerprint" for the wafer process. If the data does not match the expectations for the process step, the wafer or lot is flagged for further analysis and action(s). Concurrently, the weight change for the wafer is also used to determine the proper tolerance for the wafer weight measurements.

In order to function as desired, the wafer aligner relies on the ability to manipulate the position of the wafer. Furthermore, due to the fact that the wafer chuck needs to rotate and secure the wafer (with vacuum or other friction means), it is difficult to integrate the weigh cell directly into the chuck. The Applicants have discovered a solution in which an offset arm cantilevers a support for the wafer from the weighing cell, above the aligner. More specifically, in accordance with the invention, there is provided a wafer characterization apparatus comprising an aligner comprised of a chuck for receiving and rotating the wafer, an object sensor for detecting the position of the wafer as it is rotated, means for lowering and raising the wafer vertically, and means for moving the chuck horizontally; and a weighing scale comprising a weight sensor disposed proximate to the aligner, and a cantilevered arm extending laterally from the weight sensor over the chuck of the aligner, the cantilevered arm having a through hole surrounding the chuck. The chuck is vertically movable by a first actuator relative to the weighing scale from a first position in which the wafer is supported by the chuck to a second position in which the wafer is supported by the cantilevered arm of the weighing scale. The chuck is horizontally movable by a second actuator relative to the weighing scale from a first horizontal position to a second horizontal position, thereby enabling the apparatus to align the center of rotation of the wafer with the center of rotation of the chuck. At least a portion of the object sensor may be made movable from a first position proximate to the wafer to a second position retracted from the wafer, thereby providing clearance for a camera or wafer imager to be deployed proximate to the wafer. The apparatus may be further comprised of a wafer cassette weighing cell.

Also according to the present disclosure, a method for characterizing a wafer is provided comprising placing the wafer on an aligner comprising a rotary chuck, determining the offset of the center of rotation of the wafer from the center of rotation of the chuck, moving the chuck and wafer vertically with respect to a cantilevered arm of a weighing scale to place the wafer on the cantilevered arm, measuring the weight the wafer with the weighing scale, moving the chuck horizontally so as to align the center of rotation of the wafer with the center of rotation of the chuck, and moving the chuck and wafer vertically to remove the wafer from the cantilevered arm.

Alternative configurations of the Applicants' wafer characterization apparatus are contemplated. In certain embodiments, the apparatus may be comprised of a weighing scale, and an aligner disposed upon the weighing scale. The weighing scale may include a chuck configured to receive and rotate the wafer, a vertical actuator operatively connected to the chuck, and a support for receiving the wafer. In such a configuration, the chuck is vertically movable relative to the support from a first position in which the wafer is supported by the chuck to a second position in which the wafer is supported by the support. The apparatus may include a horizontal actuator operatively connected to the chuck, wherein the chuck is horizontally movable by the horizontal actuator relative to the support from a first horizontal position to a second horizontal position.

A related method for characterizing the wafer may include placing the wafer on an aligner disposed upon a weighing scale and comprising a rotatable chuck; measuring the weight of the wafer and the aligner with the weighing scale; determining the offset of the center of rotation of the wafer from the center of rotation of the chuck; moving the chuck and wafer vertically with respect to a wafer support to place the wafer on the support; moving the chuck horizontally so as to align the center of rotation of the wafer with the center of rotation of the chuck; and moving the chuck vertically to remove the wafer from the support. The weight of the wafer may be determined by subtracting the weight of the aligner from the measured weight of the wafer and aligner.

In other embodiments, the apparatus may be comprised of a rotary chuck disposed upon a weighing scale, and an aligner comprising a vertical actuator operatively connected to a wafer support. The aligner wafer support is vertically movable relative to the chuck from a first position in which the wafer is supported by the chuck to a second position in which the wafer is supported by the wafer support. The apparatus may include a horizontal actuator operatively connected to the chuck, wherein the chuck is horizontally movable by the horizontal actuator relative to the support from a first horizontal position to a second horizontal position. The rotary chuck may be comprised of a rotatable chuck support operatively connected to a rotary motor.

A related method for characterizing the wafer may include placing the wafer on rotary chuck disposed upon a weighing scale; measuring the weight of the wafer and the rotary chuck with the weighing scale; determining the offset of the center of rotation of the wafer from the center of rotation of the chuck; moving a wafer support vertically with respect to the chuck and wafer to place the wafer on the support; moving the wafer support horizontally so as to align the center of rotation of the wafer with the center of rotation of the chuck; and moving the wafer support vertically to place the wafer on the chuck. The weight of the wafer may be determined by subtracting the weight of the chuck from the measured weight of the wafer and chuck.

Also according to the present disclosure, an alternative option for adding a weight sensor to a wafer handling system is provided, in which the weight sensor is integrated into a wafer handling robot. The robot may be comprised of a robot arm comprising an end effector for receiving the object, and a weight sensor located in the robot arm so as to provide a signal representative of the weight of the object when the object is lifted by the arm. The weight sensor may be contained in a weigh cell joined to the robot arm, with the end effector being joined to the weigh cell. In addition, a further option is to integrate the weight sensor as a separate station.

Systems with differing robot configurations or other reasons related to manufacturability may be more optimal with this configuration.

BRIEF DESCRIPTION OF THE DRAWINGS

The present disclosure will be provided with reference to the following drawings, in which like numerals refer to like elements, and in which.

Figure 1:
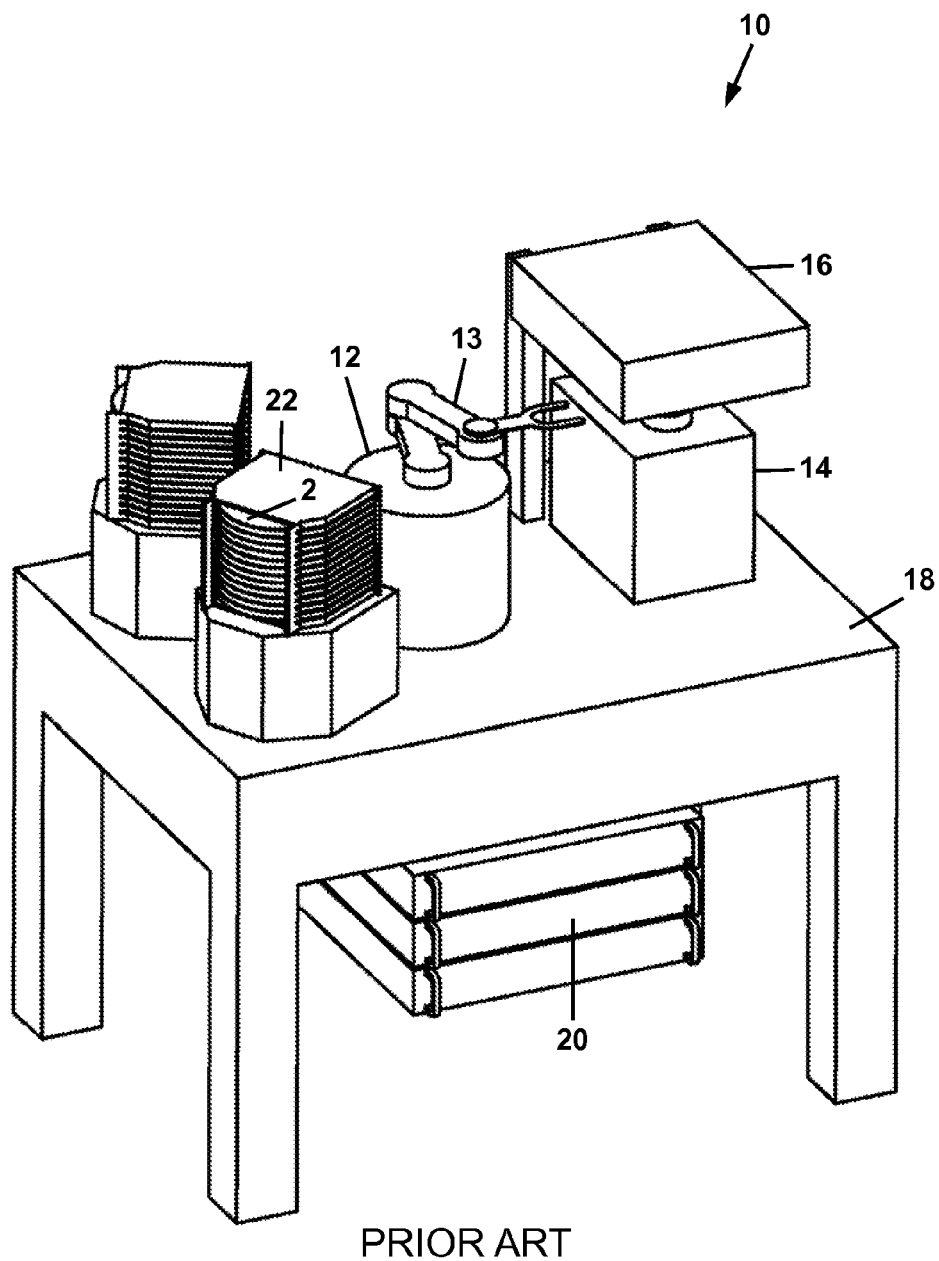
FIG. 1 is a perspective view of a first wafer characterization station comprising a wafer aligner.
Figure 2:
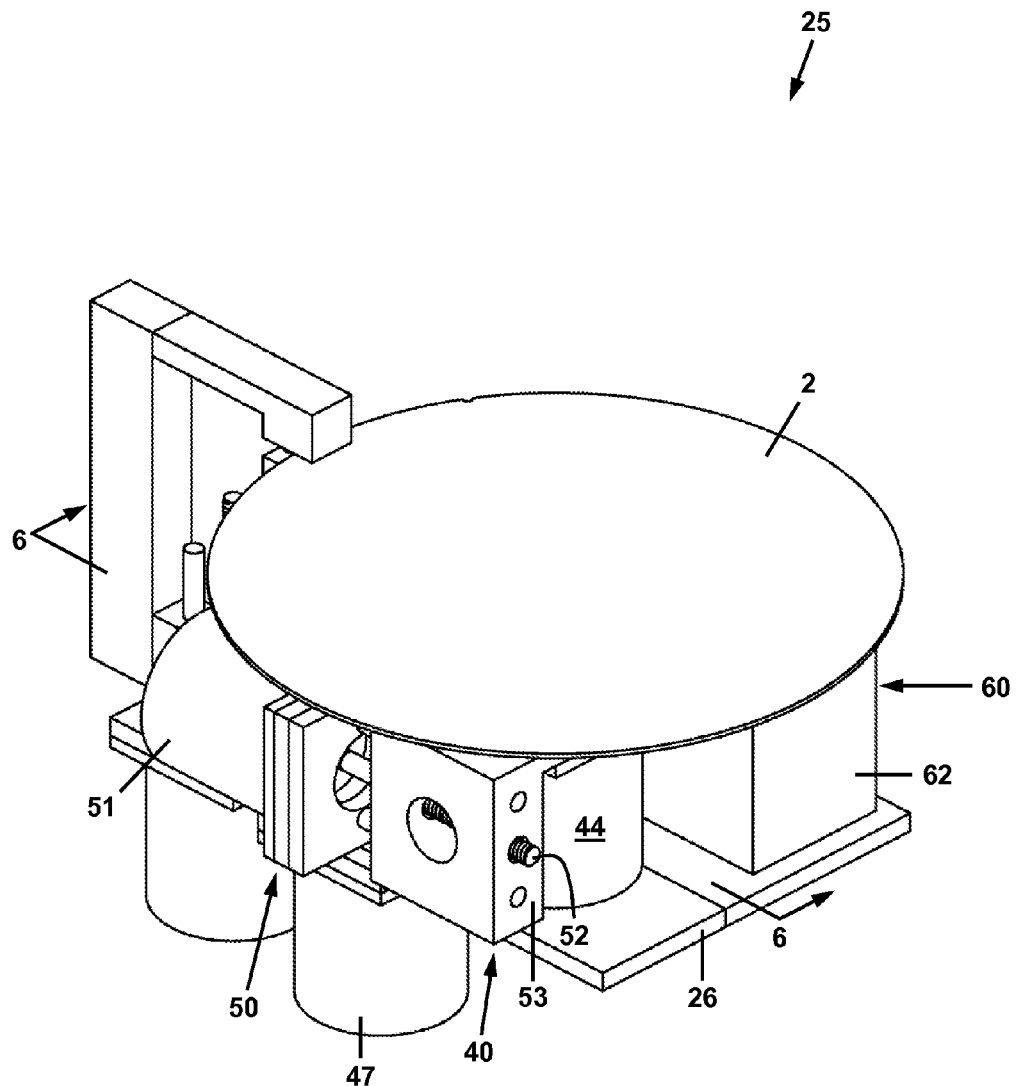
FIG. 2 is a front perspective view of a wafer characterization apparatus of the present disclosure, including a wafer being characterized thereby.
Figure 3:
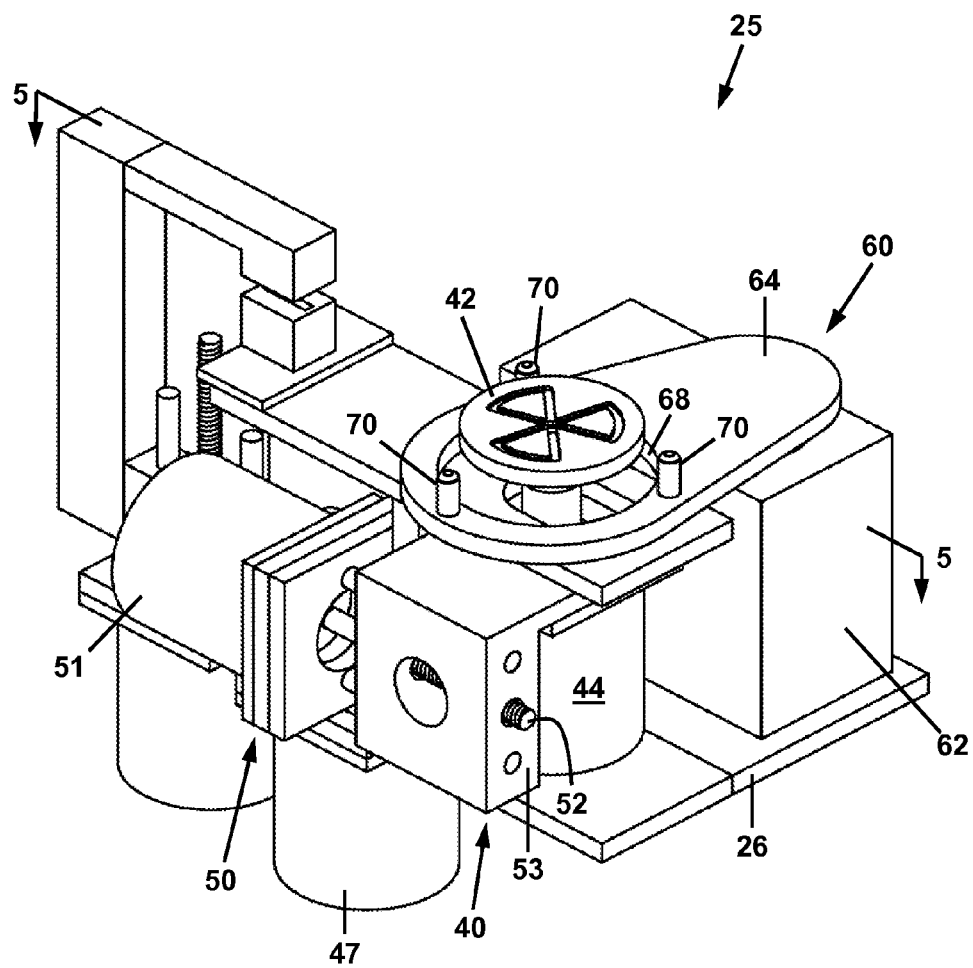
FIG. 3 is a front perspective view of the wafer characterization apparatus of FIG. 2, shown without the wafer.
Figure 4:
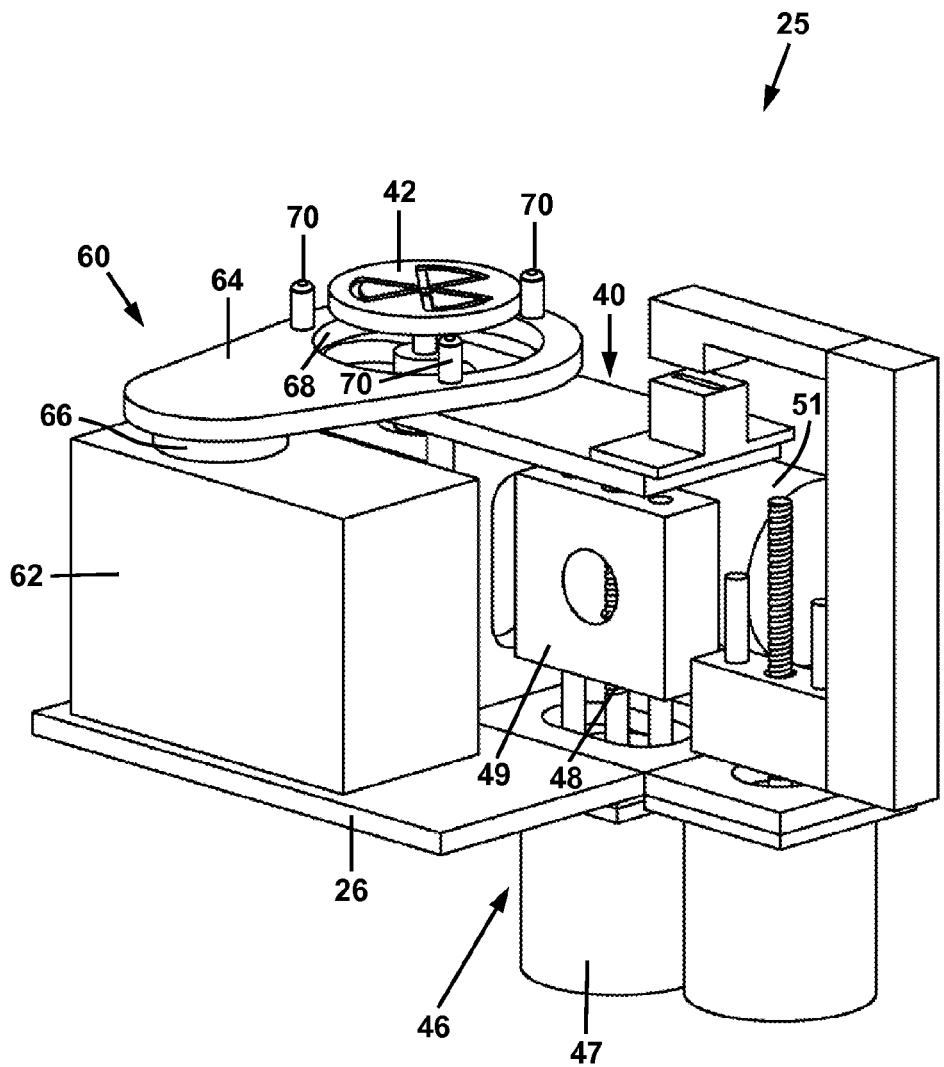
FIG. 4 is a rear perspective view of the apparatus of FIG. 3.
Figure 5:
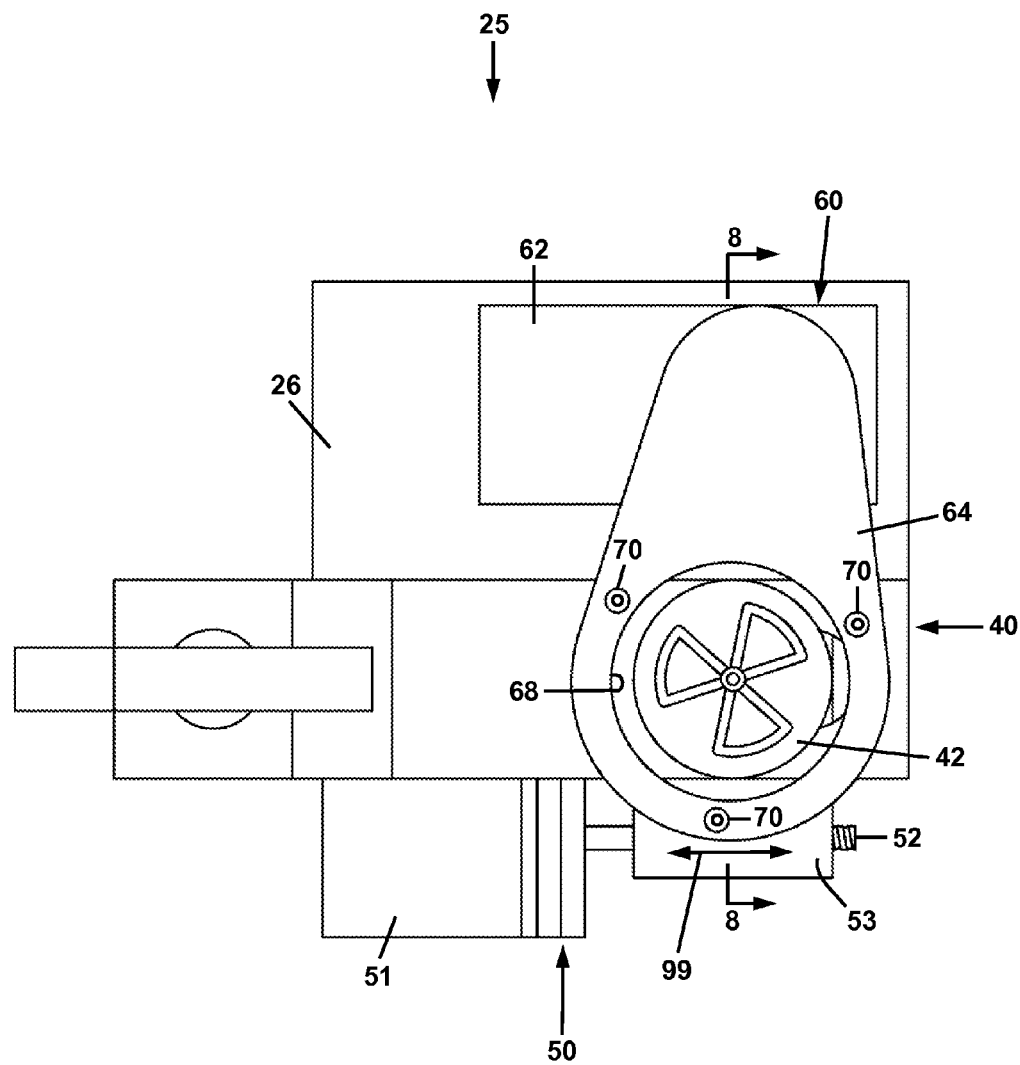
FIG. 5 is a top view of the apparatus of FIG. 3 taken along line 5-5 of FIG. 3.

The present invention will be described in connection with a preferred embodiment. However, it is to be understood that there is no intent to limit the invention to the embodiment described. On the contrary, the intent is to cover all alternatives, modifications, and equivalents as may be included within the spirit and scope of the invention as defined by the appended claims.

DETAILED DESCRIPTION

For a general understanding of the present invention, reference is made to the drawings. In the drawings, like reference numerals have been used throughout to designate identical elements. In the following disclosure, the present invention is described in the context of its use as an apparatus and system for characterizing a wafer. However, it is not to be construed as being limited only to use in wafer characterization. The invention is adaptable to any use in which it is desirable to characterize an object by positioning it and weighing it using a single apparatus, and optionally obtaining an image of the object or performing another characterization step. Additionally, the description identifies certain components with the adjectives "top," "upper," "bottom," "lower," "left," "right," "front," "back," etc. These adjectives are provided in the context of use of the apparatus in characterizing wafers, and in the context of the orientation of the drawings.

The instant apparatus for characterizing a wafer will be first described with reference to FIGS. 2-6, and 8-11. Subsequently, methods of and a system for characterizing a wafer will also be described with reference additionally to FIGS. 7A-7E, and FIGS. 12-14.

Referring first to FIGS. 2-6, 8, and 9, a wafer characterization apparatus 25 is shown. The apparatus 25 is comprised of an aligner 40, which aligns the center of rotation of the wafer with the center of rotation of the chuck, and a weighing scale 60, which measures the weight of the wafer. The aligner 40 and weighing scale 60 are configured and integrated at a wafer characterization station so that the steps of aligning and weighing can be performed by the apparatus 25, without the need to move the wafer 2 to another location. The aligner 40 and weighing scale 60 may be disposed upon a base plate 26, which may be made integrally with or mounted to a base similar to the base 18 of FIG. 1. For the sake of simplicity of illustration, such a base or other support fixture is not shown in FIGS. 2-11.

The aligner 40 is comprised of a rotatable chuck 42 for receiving the wafer 2 from a human operator, a robot, or another handling device, and for rotating the wafer as part of the alignment process. The chuck 42 is rotated by a motor 44. The aligner 40 is further comprised of a first linear actuator 46 for displacing the chuck 42 and motor 44 vertically, and a second linear actuator 50 for displacing the chuck 42 and motor 44 horizontally. In the embodiment depicted in FIGS. 3-6 and 9, the first linear actuator 46 is comprised of a first rotary motor 47, with a shaft driving a lead screw 48, which is engaged with a threaded drive block 49. In like manner, the second linear actuator 50 is comprised of a second rotary motor 51, with a shaft driving a lead screw 52, which is engaged with a threaded drive block 53. Other means for lowering and raising the chuck and wafer vertically, and means for moving the chuck horizontally are contemplated, such as linear stepper motors, or small pneumatic or hydraulic cylinders. The operation of these actuators 46 and 50 during the wafer alignment process will be described subsequently herein.

The weighing scale 60 is comprised of a weighing sensor, such as a calibrated spring, load cell, or another suitable weight measuring sensor, which is contained in a housing 62 that is proximate to the aligner 40 on base plate 26. The weighing scale 60 is further comprised of a cantilevered arm 64 that is joined to and extends laterally from a support pillar 66, which in turn is in communication within the weighing sensor (not shown) in housing 62. The cantilevered arm 64 extends laterally over the chuck 42 of the aligner 44, and has a through hole 68 surrounding the chuck 42. The cantilevered arm 64 is provided with a support around the through hole 68 for receiving the wafer 2 when the chuck 42 is lowered during the wafer alignment process. In the embodiment depicted in FIGS. 3-6 and 9, the support is comprised of at least three pins 70 that extend upwardly from the cantilevered arm 64. Other support configurations, such as a solid ring of material surrounding the hole, are contemplated.

The simultaneous wafer aligning and weighing steps, which are made possible by the unique configuration of the instant wafer characterization apparatus 25, will now be described with reference in particular to FIGS. 7A-7E. (It is noted that for the sake of simplicity of illustration, the linear actuator 83 of the optical probe 80, which is shown in FIGS. 2-4, 6, and 9, is not shown in FIGS. 7A-7E.)

Figure 6:
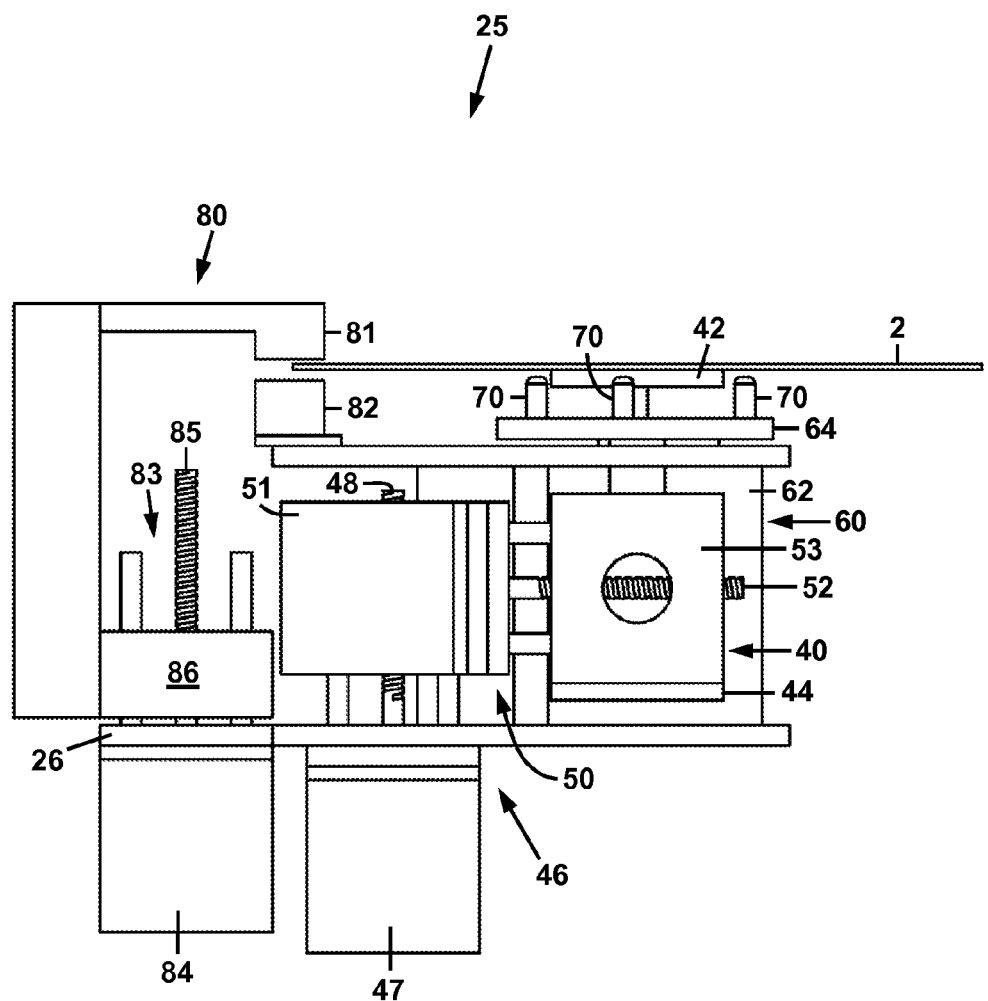
FIG. 6 is a first front view of the apparatus of FIG. 2 taken along line 6-6 of FIG. 2.
Figure 7A:
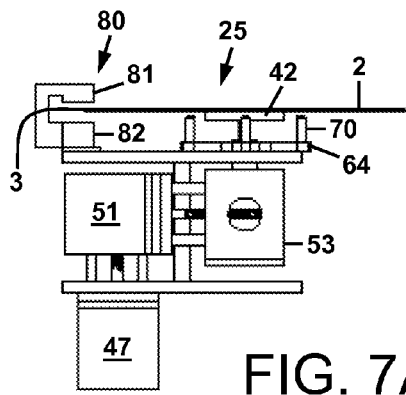
FIGS. 7A-7E are front views of the apparatus of FIG. 3 depicting a sequence of operations for aligning a wafer on the chuck of an aligner.

Referring first to FIGS. 6 and 7A, a wafer 2 has been placed on the chuck 42 of the aligner 40. The chuck 42 may have a vacuum provision (not shown), or a friction coating such as silicone rubber so as to positively engage the wafer in order to rotate it. It is assumed that the wafer 2 has not been placed on the chuck 42 such that the center of rotation of the wafer 2 and the center of rotation of the chuck 42 are aligned. Therefore, the wafer 2 must be aligned on the chuck 42, and additionally, the wafer 2 must be rotated to a specific position for imaging. These are two functions of the aligner 42.

In FIG. 7A, the wafer 2 is rotated through at least one full rotation, while the optical sensor 80 detects the position of the edge 3 of the wafer 2 as a function of angular position. The optical sensor may be comprised of a light source 81 and a light detector 82, wherein the amount of light transmitted from the source 81 to the detector 82 depends upon the position of the wafer edge 3. Other optical and electrical sensors, such as a sensor based upon reflected light or capacitance, may be suitable. As the wafer 2 is rotated 360 degrees past the edge sensor 80, data is collected that is, in effect, a map of the wafer edge 3 using polar coordinates. This data is acquired by a computer (not shown), which can compute the polar offset of the wafer 2. Once that computation is made, the wafer 2 is rotated to the angle of the maximum offset, wherein the direction of the maximum offset is aligned parallel to the direction of movement of the horizontal linear actuator 50 as indicated by bidirectional arrow 99 of FIG. 5.

Figure 7B:
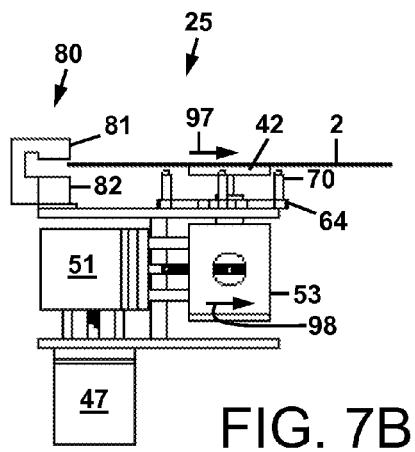
Figure 7C:
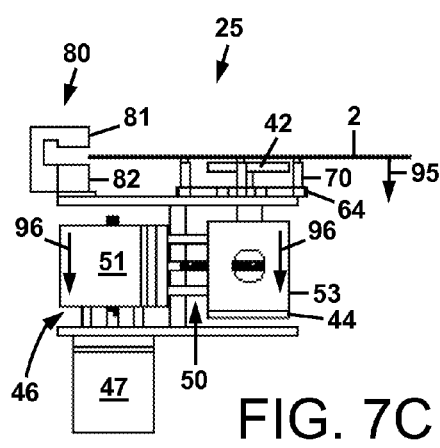

With the amount of the maximum offset now known and so aligned with respect to the horizontal linear actuator 50, the wafer 2 may now be moved as a first step in centering it on the chuck 42. Referring to FIG. 7B, the horizontal linear actuator 50 is operated as indicated by arrow 98, thereby moving the motor 44, chuck 42, and wafer 2 laterally as indicated by arrow 97.

Referring now to FIGS. 6 and. 7C, the vertical linear actuator 46 is now operated to lower the horizontal linear actuator 46, turntable motor 44 and turntable 42 as indicated by arrows 96, as well as to lower the wafer 2 as indicated by arrow 95. During this lowering, the wafer 2 comes to rest upon the support pins 70 of the cantilevered arm 64 of the weighing scale 60. The turntable 42 is separated from the wafer 2. At this point in the alignment process, the weight of the wafer 2 is entirely borne by the cantilevered arm 64. Accordingly, at this point, the weight of the wafer 2 is measured by the weighing scale 60. The weight value may be displayed and/or stored in the computer (not shown). Thus the weight of the wafer 2 is measured simultaneously with the wafer alignment process, which is enabled by the integration of the weighing scale 60 and aligner 40 in the instant wafer characterization apparatus 25.

Figure 7D:
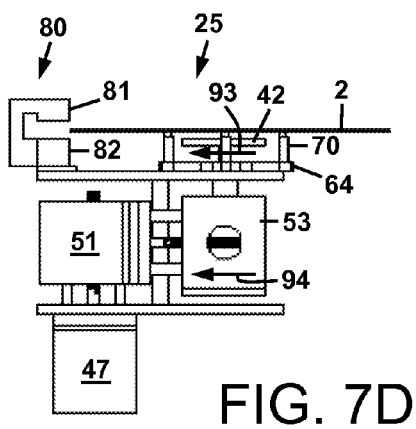

Referring to FIG. 7D, during the weighing of the wafer 2, or immediately thereafter, as it sits upon the pins 70 of the cantilevered arm 64, the horizontal linear actuator 50 is operated as indicated by arrow 94, thereby moving the motor 44, chuck 42, and wafer 2 laterally as indicated by arrow 93. The amount movement of the wafer 2 and chuck 42 in FIG. 7B, and the amount of movement of the chuck 42 in FIG. 7D are determined by the computer so as to locate the axis of rotation of the chuck 42 at the same location as the axis of rotation of the wafer 2, i.e., the wafer 2 is precisely centered upon the chuck 42.

Figure 7E:
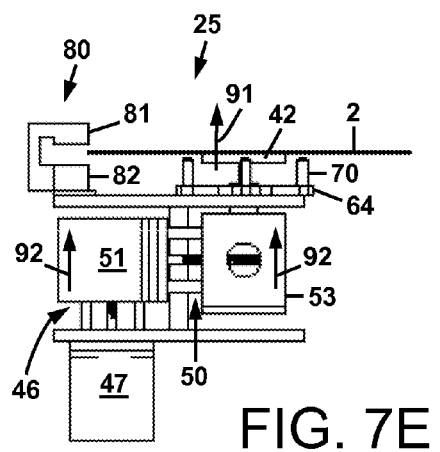
Figure 8:
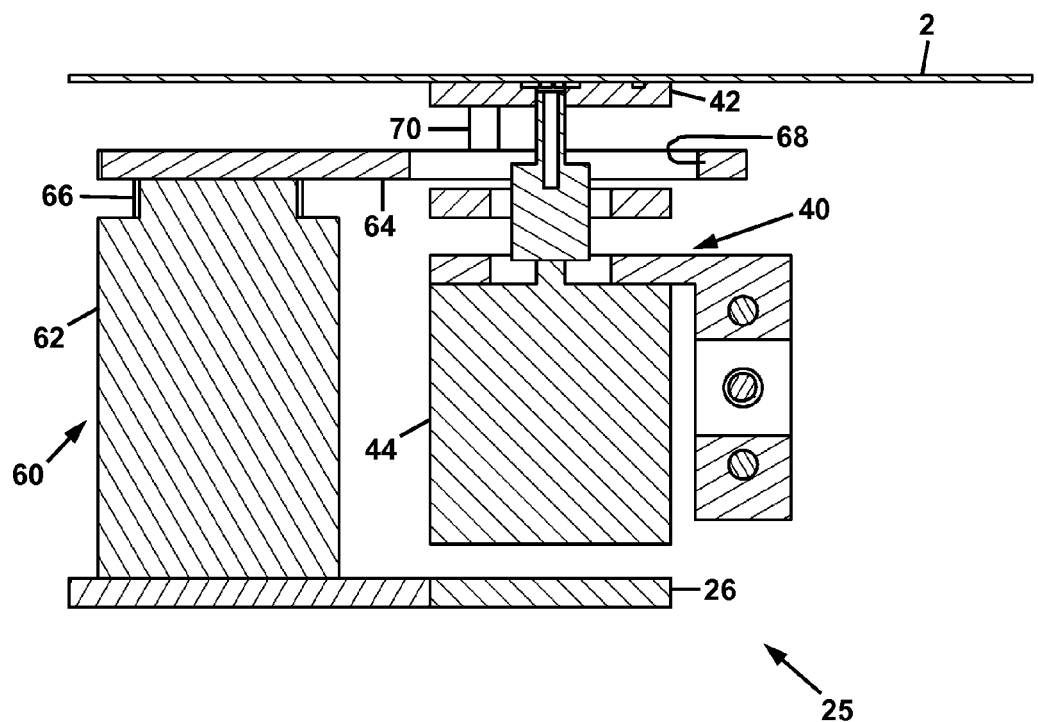
FIG. 8 is a side cross-sectional view of the apparatus of FIG. 3 taken along line 8-8 of FIG. 5.

Referring to FIG. 7E, the vertical linear actuator 46 is now operated to raise the horizontal linear actuator 50, turntable motor 44 as indicated by arrows 92, as well as to raise the wafer 2 and turntable 42 as indicated by arrow 91. During this raising, the wafer 2 is removed from the support pins 70 of the cantilevered arm 64 of the weighing scale 60, and again carried by the turntable 42. The turntable 42 is then rotated so as to align the flat or notch of the wafer 2 to a specific location required for imaging of the wafer. Additionally, the wafer 2 may be rotated a full 360 degrees, with data acquired by the optical sensor 80. This data may be used to confirm that the wafer 2 is properly centered on the chuck 42 to within a predetermined specification. If the specification is not met, the alignment procedure of FIGS. 7A-7E may be repeated.

It is to be understood that the alignment procedure may vary from that shown in FIGS. 7A-7E. For example, after the wafer offset is determined in FIG. 7A, the wafer 2 may be lowered onto the pins 70 of the cantilevered arm 64, and weighed. The turntable 42 may then be moved beneath the wafer 2 to where the wafer and turntable axes of rotation are aligned, and the turntable 42 raised. It is also to be understood that the aligner 40 may be configured other than shown in FIGS. 2-9. For example, the aligner may operate to contact the edge of the wafer 2, and mechanically push the wafer 2 into the centered position on the turntable 42. The operative requirement is that at some point during the alignment process, the turntable 42 and wafer 2 are separated, such that the wafer 2 is supported only by the cantilevered arm 64, thereby enabling a measurement of the weight of the wafer 2 by the weighing scale 60.

In the instant wafer characterization apparatus 25, the cantilevered arm 64 replaces the fixed wafer support of the wafer aligner 14 of FIG. 1. This improvement enables the weight sensor to be integrated with the aligner directly, without affecting the aligner performance. It is noted that by using the cantilevered arm 64, some additional forces are applied to the support pillar 66 and the weighing sensor. Rather than a simple mass centered on the support pillar 66 and weighing sensor, the mass is offset by a horizontal distance. In one embodiment of the apparatus 25, this distance is about 75 mm. The net effect is an additional moment of force on the support pillar 66 and weighing sensor. The weighing scale 60 can be calibrated to take this moment into consideration when determining the wafer weight. In alternative embodiments (not shown) where the weighing scale is not able to compensate for the moment of the cantilevered arm, mechanical means is used. For example the cantilevered arm 64 can be extended by about an equal length in the opposite direction; or the cantilevered arm can be provided with a counterweight of a dense material (such as a lead weight) located on the opposite side of the support pillar 66 to substantially balance the arm 64 over the support pillar 66. In any of these configurations, the weighing scale 60 of the apparatus 25 is provided with the capability to take these additional forces into account while still providing a high resolution, accurate weight determination of the wafer 2.

Figure 9:
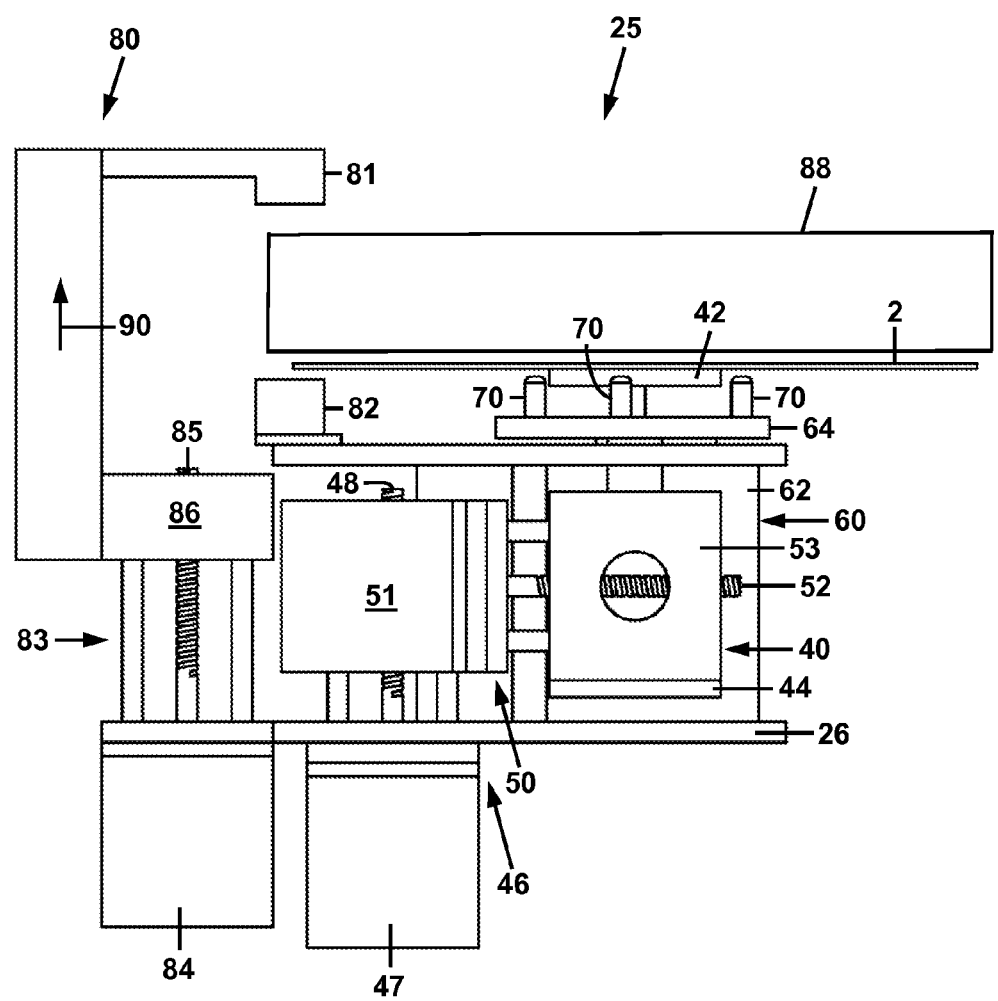
FIG. 9 is a second front view of the apparatus of FIG. 2 taken along line 6-6 of FIG. 2, but with a sensing arm of the apparatus raised to accommodate a wafer imager for imaging the wafer.
Figure 10A:
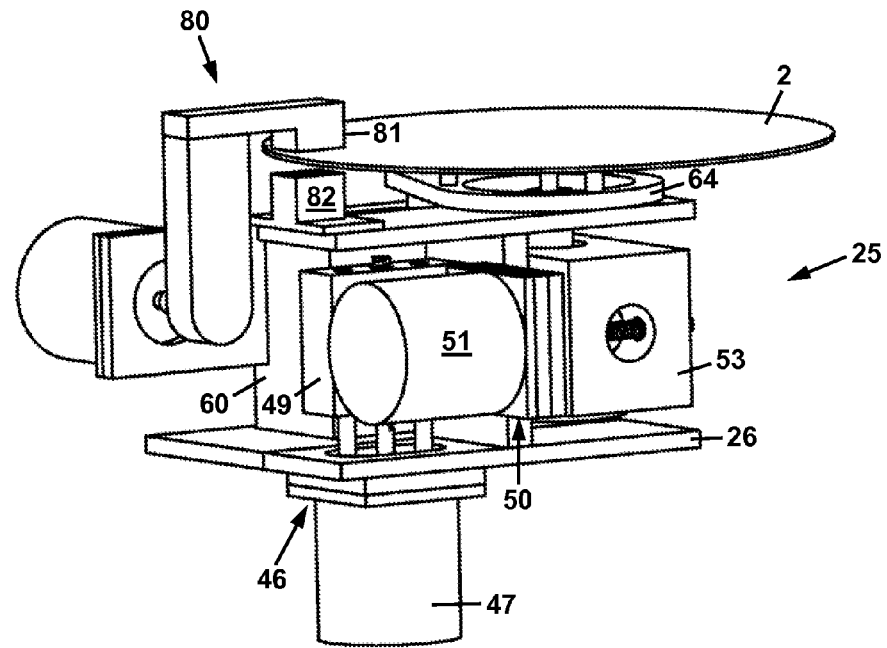
FIG. 10A is a front perspective view of a first alternative wafer characterization apparatus comprising a rotatable scanning arm deployed in the wafer sensing position.
Figure 10B:
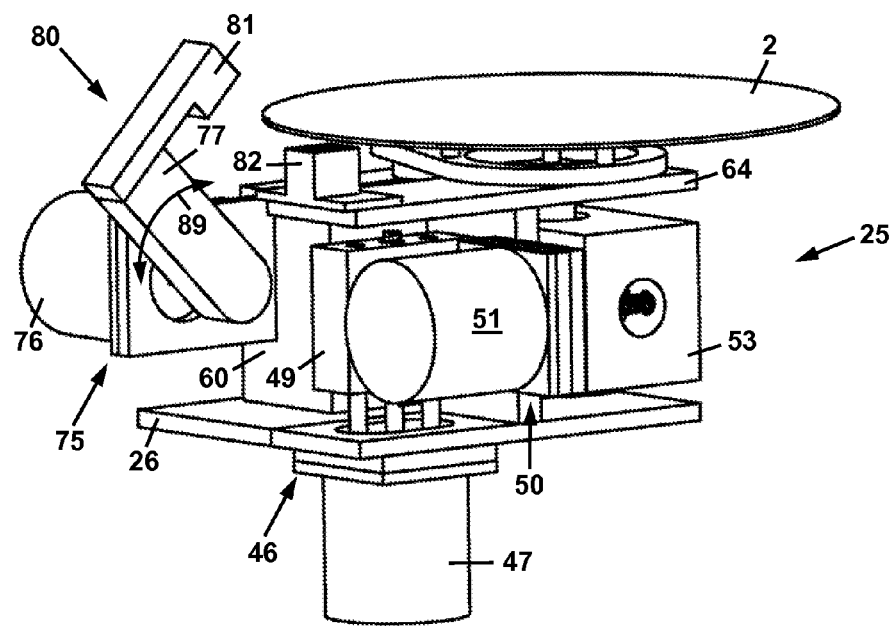
FIG. 10B is a front perspective view of the apparatus of FIG. 10A, shown with the rotatable scanning arm retracted from the wafer sensing position to accommodate a wafer imager for imaging the wafer.

With the wafer 2 now weighed, properly centered upon the chuck 42, and rotated to the desired angular position, the wafer may be imaged. Referring to FIG. 9, the wafer characterization apparatus 25 may be provided with an optical sensor 80 having an upper light source (and/or sensing head) 81 that is adjustable as indicated by arrow 90, so as to make room for a wafer imager 88 to be positioned above the wafer. The upper light source 81 may be operatively connected to a linear actuator 83, which may be comprised of a motor 84 and lead screw 85 that is engaged with a threaded drive block 86. Referring also to FIGS. 10A and 10B, in an alternative embodiment, the station 25 may be provided with an optical sensor 80 having an upper light source 81 that is rotatably adjustable, as indicated by arcuate arrow 89. The upper light source 81 may be operatively connected to a rotary actuator 75, which may be comprised of a motor 76 and rotary arm 77.

The instant wafer characterization apparatus 25 may further include a wafer cassette weighing cell. By providing such a cell to detect the weight of a cassette, the weight of each individual wafer can be determined with a high degree of accuracy when it is removed from the cassette. This can provide a backup or alternative means of obtaining the weights of wafers by the characterization apparatus 25.

Figure 11:
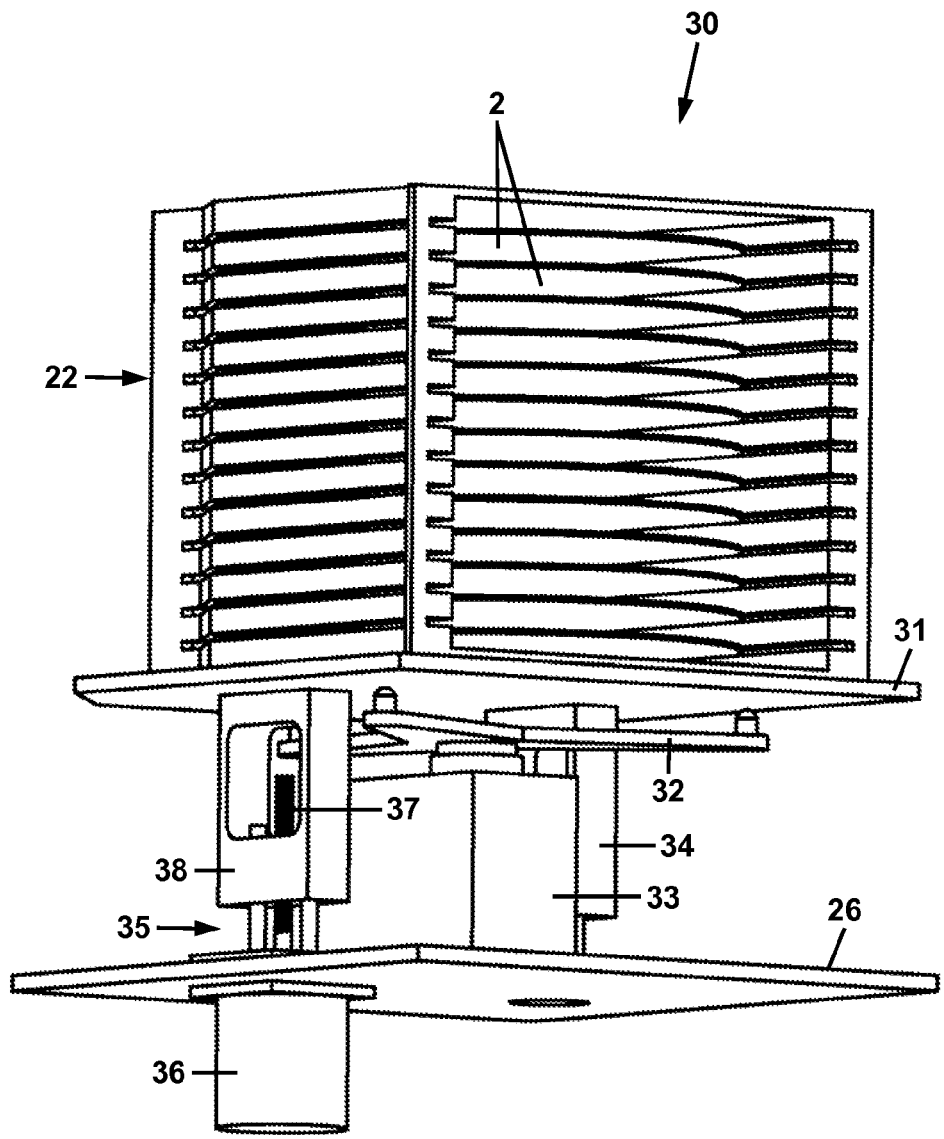
FIG. 11 is a lower perspective view of a scale apparatus for weighing cassettes of wafers, the apparatus being combinable with the wafer characterization apparatus of FIGS. 2-10B.

Referring to FIG. 11, the cassette weighing cell 30 may be comprised of a platform 31 for supporting the cassette 22, a kinematic support 32, a weight sensor 33, at least one lift guide 34, and a linear actuator 35 joined to the base plate 26. The linear actuator 35 may be comprised of a motor 36 and lead screw 37 that is engaged with a threaded lift drive block 38. In use, the lift drive block 38 lowers the cassette 22 onto the kinematic support 32, thereby protecting the sensitive weight sensor 33 and ensuring an accurate weight measurement. The kinematic support 32 ensures that the center of gravity for the cassette 22 is centered on the weight sensor 33.

Figure 15A:
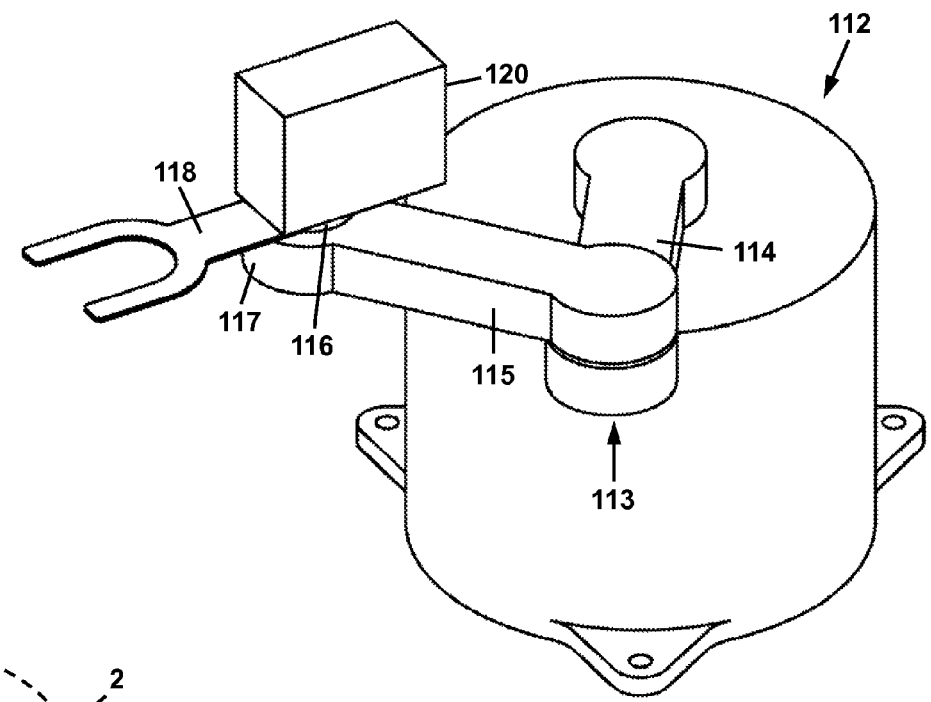
FIG. 15A is a perspective view of a first alternative option for integrating a weighing means into a robot of a wafer handling system.
Figure 15B:
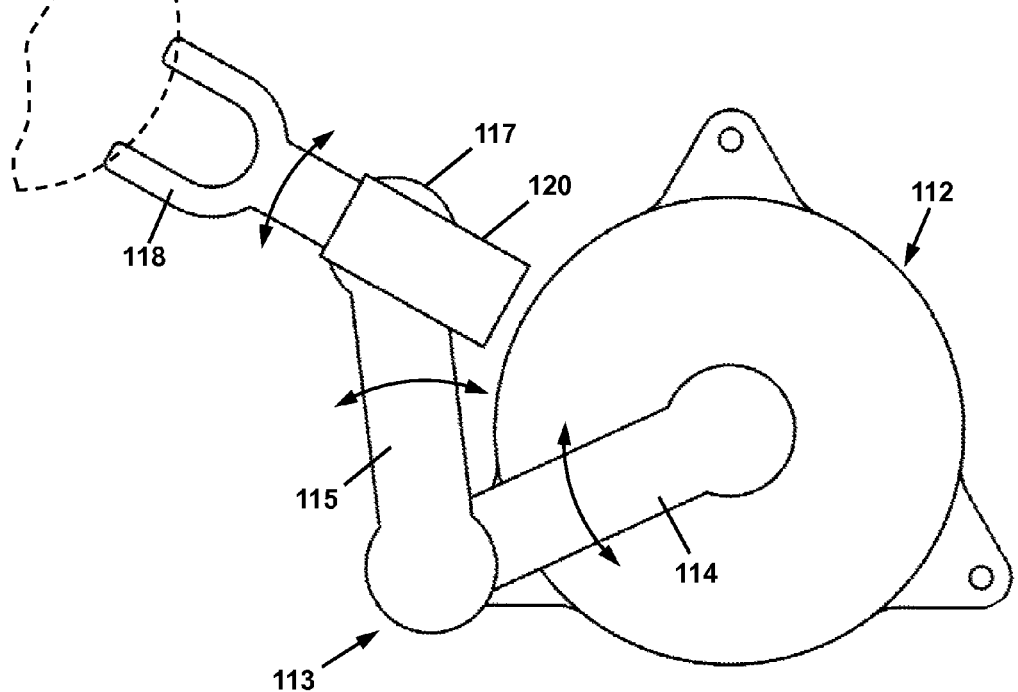
FIG. 15B is a top view of the wafer handling robot of FIG. 15A.

An alternative option for adding a weight sensor to a wafer handling system is to integrate the weight sensor into the wafer handling robot. This is best understood with reference to FIGS. 15A-16. Referring first to FIG. 15A, a wafer handling robot 112 comprising an arm assembly 113 is provided. The arm assembly 113 may be comprised of a first arm 114 pivotably joined to a second arm 115. A weigh cell 120 is joined to a pivotable joint 116 at the distal end 117 of the second arm 115. An end effector 118 for supporting and articulating a wafer 2 is joined to the weigh cell 120. It can be seen that in operation, the weigh cell 120 is located in close proximity to the wafer 2 and moves with the robot arm assembly 113 and end-effector 118. Such an arrangement will likely provide the most accurate wafer weight measurements. However other arrangements of integrating the weigh cell 120 into the arm assembly 113 are contemplated.

To ensure accurate weight measurements of wafers or other objects handled by the robot 112, the stability of the robot 112 during the weight determination is considered. Robot control software may be provided, which can adjust parameters to disable servo or other robot actuator adjustments during object weighing. The overall wafer handling system is also structured so as to prevent external influences such as air drafts or vibration from affecting the sensitive weight measurements.

Figure 16:
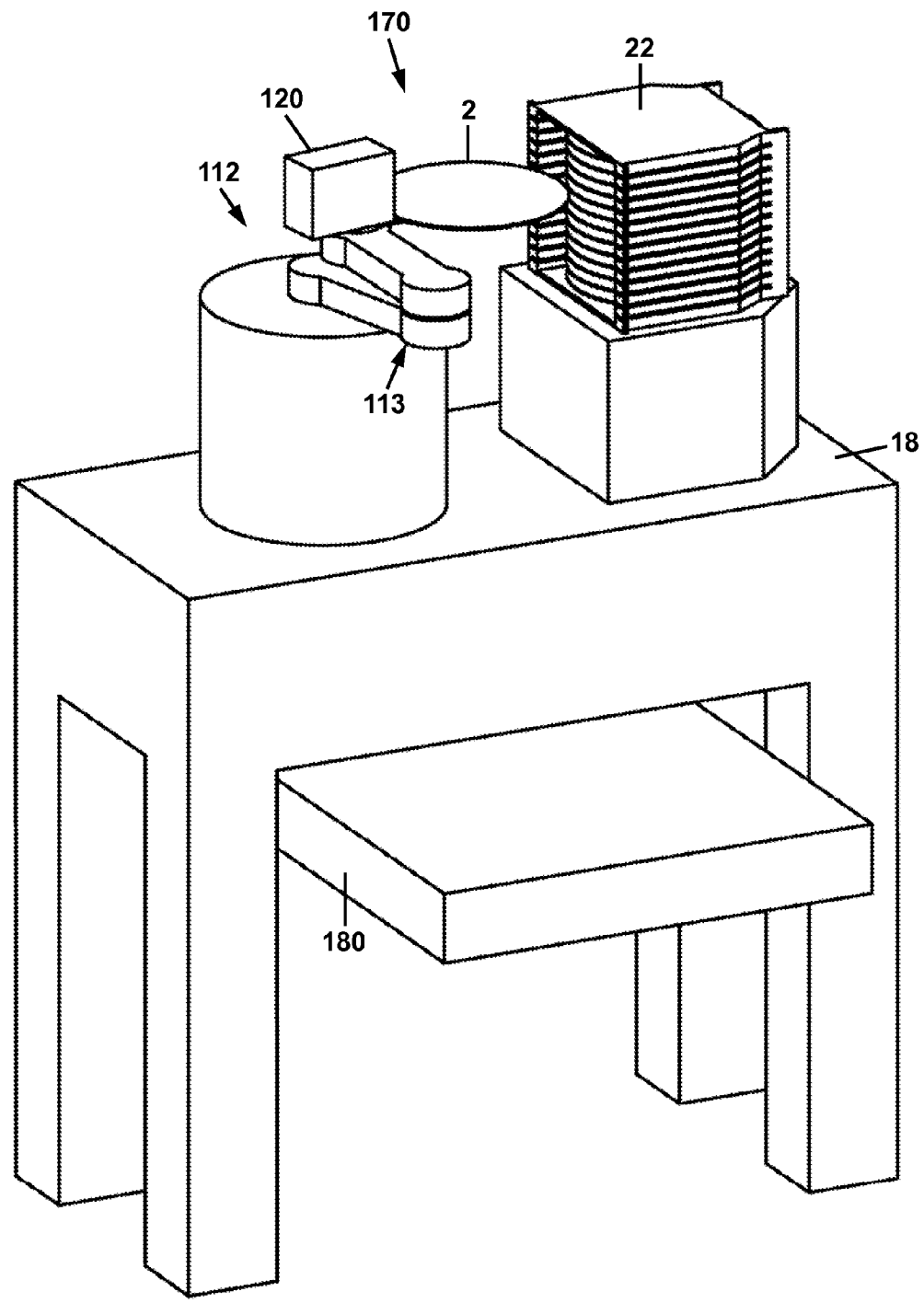
FIG. 16 is a perspective view of a wafer handling system in which the robot of FIGS. 15A and 15B withdraws individual wafers from a cassette, weighs them, and may further transport them to another destination.

The robot 112 with integrated weighing capability may be used in a wafer handling system which further includes wafer imaging capability as described previously herein. The robot 112 may withdraw individual wafers one by one and weigh them while also placing them proximate to a camera, scanner, or other imaging means. Alternatively, the robot 112 with integrated weighing capability may be provided in a system that includes weight measurement only. Referring to FIG. 16, a wafer handling system 170 is provided in which the robot 112 of FIGS. 15A and 15B removes a wafer 2 from a cassette 22, weighs the wafer 2, and then replaces it in the cassette 22. The robot 112 may be provided with vertical axis capability to index upwardly and downwardly for access to all of the wafers 2 in the cassette 22, or the robot 112 or cassette 22 may be disposed on a vertically operable base (not shown) to provide access to all of the wafers 2.

In an alternative embodiment (not shown), for a simple wafer weighing system, the robot 112 may be comprised of an arm that is comprised of a single axis linear actuator. This simplified robot system may provide a more stable platform for the weigh cell 120, thereby improving weighing accuracy and throughput. The system may further include a second weigh cell (not shown) integrated into the wafer cassette pedestal for redundant and/or backup measurement capability.

Figure 17:
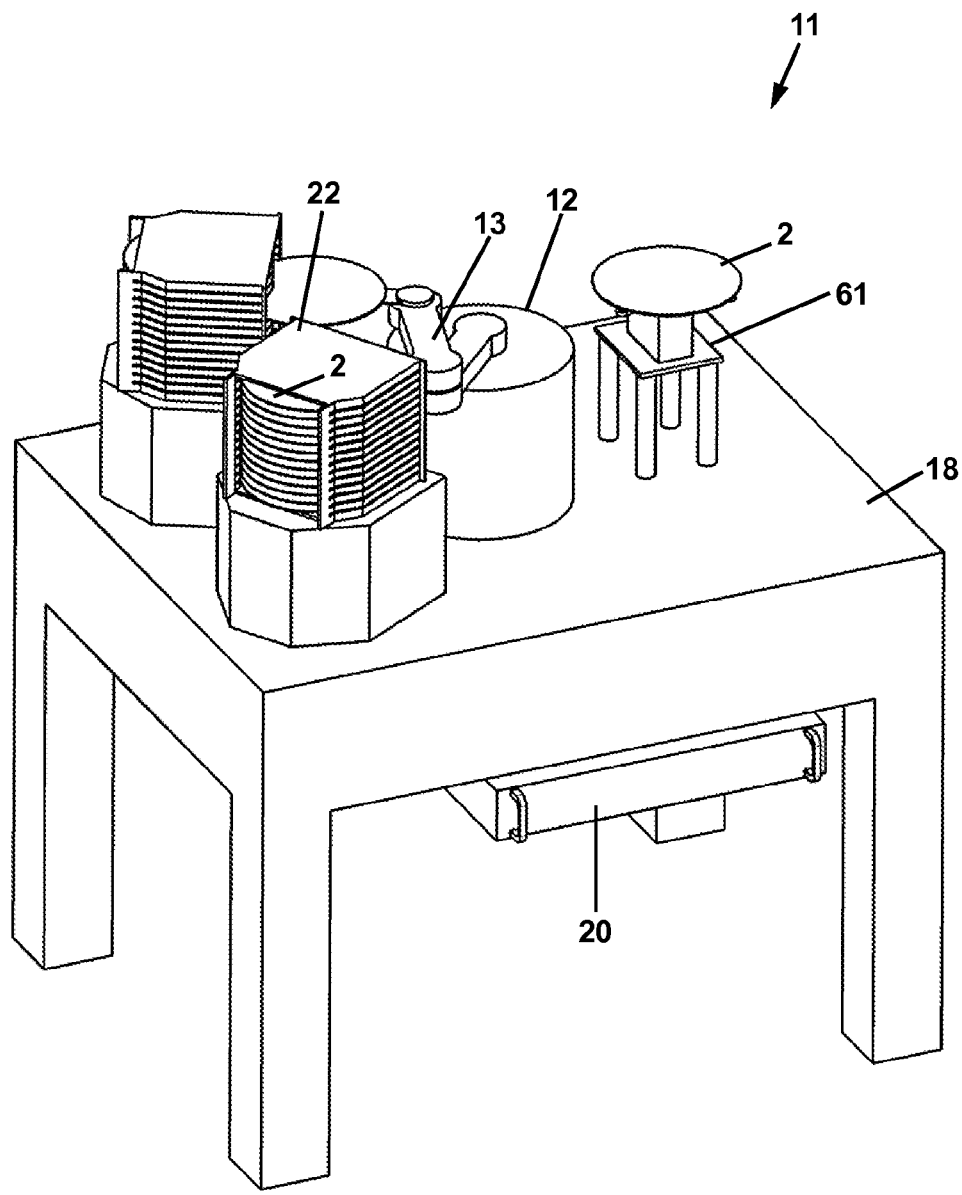
FIG. 17 is a perspective view of an alternative wafer handling system in which a robot transports a wafer to a weigh station for the purpose of determining the wafer weight without alignment or imaging.

In an alternative configuration shown in FIG. 17, the aligner, the robot 12 and the cassette platform of a characterization station 11 may be separate devices. This separated configuration may or may not combine the wafer alignment apparatus with a weigh scale 61. In this system, a wafer 2 is transferred from the cassette 22 to the weigh station 61 for measurement. Depending on the exact system configuration, once the wafer 2 is weighed, it is either transferred to the next station (not shown) for imaging or back to the wafer cassette 22.

Figure 18A:
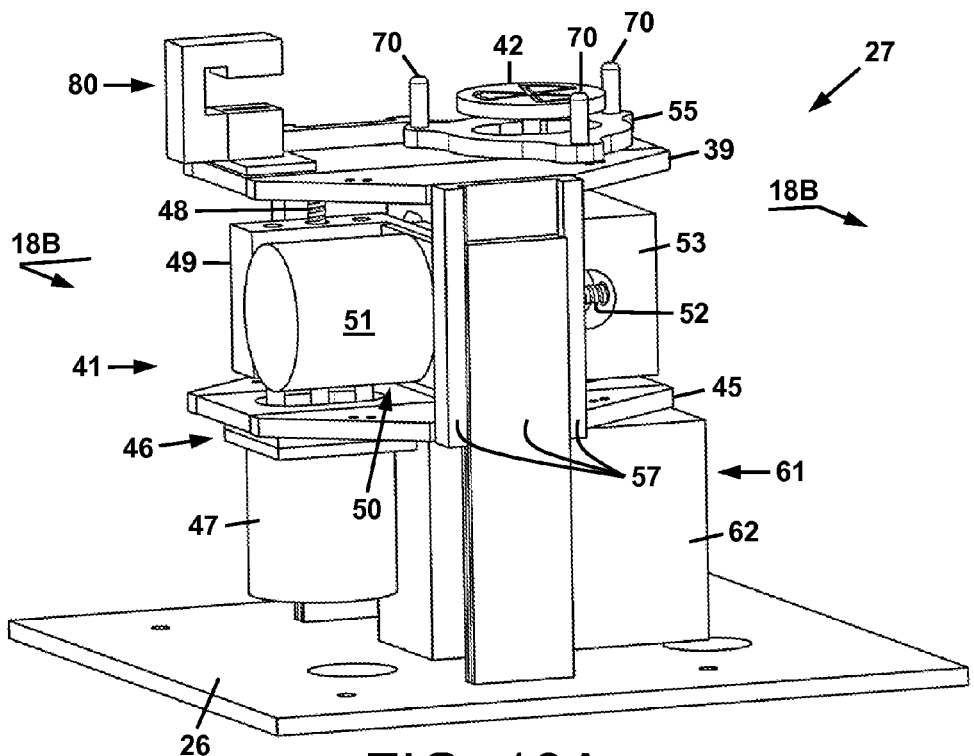
FIG. 18A is a perspective view of a second alternative wafer characterization apparatus comprising a wafer aligner device disposed on a weigh scale.
Figure 18B:
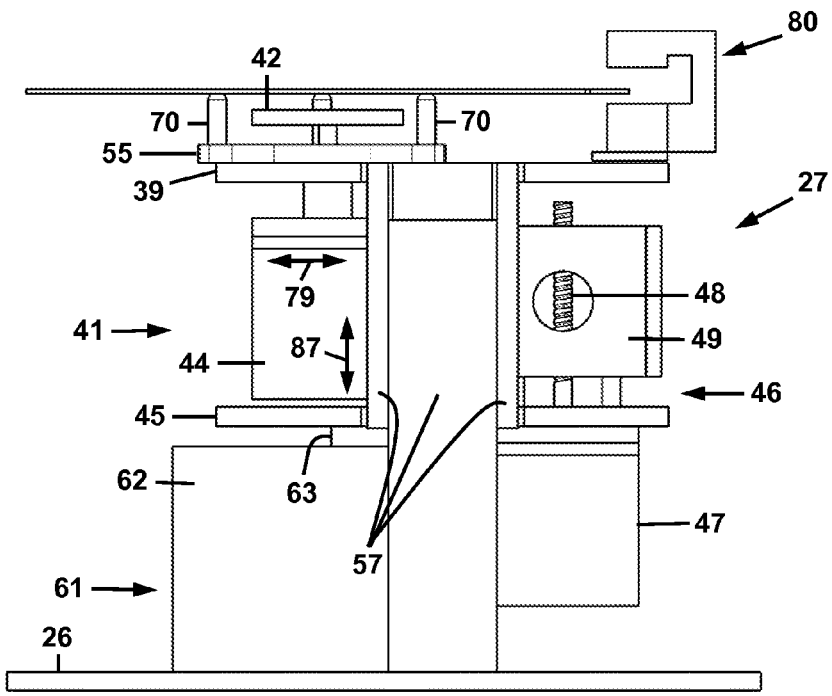
FIG. 18B is a side elevation view of the apparatus of FIG. 18A, taken along the line 18B-18B of FIG. 18A.

In accordance with the invention, alternative wafer characterization apparatus are provided, in which a wafer aligner device, or a portion thereof, is disposed upon a weighing scale. FIG. 18A is a perspective view of one such alternative wafer characterization apparatus in which the wafer aligner device is disposed on the weighing scale; and FIG. 18B is a side elevation view of the apparatus of FIG. 18A, taken along the line 18B-18B of FIG. 18A. The apparatus 27 is comprised of an aligner 41 and weighing scale 61, with functions as described for the apparatus 25 of FIGS. 2-6. The aligner 41 and weighing scale 61 may be disposed upon a base plate 26, which may be made integrally with or mounted to a base similar to the base 18 of FIG. 1.

The aligner 41 is comprised of a rotatable chuck 42 for receiving the wafer 2 from a human operator, a robot, or another handling device, and for rotating the wafer 2 as part of the alignment process. The chuck 42 is rotated by a motor 44. The aligner 41 is further comprised of a first linear actuator 46 for displacing the chuck 42 and motor 44 vertically as indicated by bidirectional arrow 87, and a second linear actuator 50 for displacing the chuck 42 and motor 44 horizontally as indicated by bidirectional arrow 79. The first linear actuator 46 may be comprised of a first rotary motor 47, with a shaft driving a lead screw 48, which is engaged with a threaded drive block 49. In like manner, the second linear actuator 50 may be comprised of a second rotary motor 51, with a shaft driving a lead screw 52, which is engaged with a threaded drive block 53. Other means for lowering and raising the chuck 42 and wafer 2 vertically, and means for moving the chuck 42 horizontally may be as recited previously for the apparatus 25 of FIGS. 2-6.

The weighing scale 61 is comprised of a weighing sensor, such as a calibrated spring, load cell, or another suitable weight measuring sensor, which is contained in a housing 62 that is disposed on base plate 26. The weighing scale 61 is further comprised of a weight bearing member 63 that is in communication within the weighing sensor (not shown) in housing 62. A first structural plate 45 of the aligner 41 is disposed upon the member 63, so that the weight of the aligner 41 (plus any wafer 2 disposed upon it) may be measured.

The aligner 41 is further comprised of a second structural plate 39, upon which is disposed a support 55 comprised of at least three pins 70 for receiving the wafer 2 during the alignment and weighing process. The structural plate 39 and support 55 are provided with through holes to accommodate a rotating shaft of motor 44, which drives chuck 42.

The operation of the apparatus 27, in which a wafer is weighed, and aligned for further characterization steps such as imaging, is similar to that described previously for the apparatus 25 of FIGS. 2-6, as shown in FIGS. 7A-7E. Referring again to FIGS. 18 A and 18B, a robot (such as robot 12 of FIG. 1) places the wafer 2 onto the aligner 41. The chuck 42 may be in a raised position (rather than the lowered position shown in FIGS. 18A and 18B), so that the wafer 2 is supported by the chuck 42. The wafer 2 may then be rotated by the chuck 42. A sensor 80 acquires wafer edge data during rotation as described previously herein for apparatus 25 of FIGS. 2-6. The wafer rotation is stopped at point where the wafer offset is parallel to the axis of the horizontal drive screw 52.

The vertical drive 46 is then operated to lower the wafer 2 and chuck 42 so that the wafer 2 is supported on the support pins 70, as shown in FIGS. 18A and 18B. The horizontal drive 50 is then operated to move the chuck 42 so that the center of rotation of the chuck 42 and the center of the wafer 2 are aligned. The vertical drive 46 is then operated to raise the wafer 2 and the chuck 42 so that the wafer 2 is supported on the chuck 42. The centered wafer 2 may then be rotated to a desired angular position for another characterization step, such as imaging.

At any time during alignment process, and preferably when no motion is occurring, the weight of the wafer 2 may be measured, regardless of whether the wafer 2 is supported by the chuck 42, or by the pins 70. The tare weight of the aligner 41 may be programmed into the scale 61, so that it is automatically subtracted out to provide the wafer weight. The apparatus may be provided with vertical linear guides 57 to aid in the stability of the aligner 41 on the scale 61. These guides 57 are of high precision and are essentially frictionless so as to not effect wafer weight measurements.

At the conclusion of the wafer weighing, alignment, and any other characterization steps, the robot 12 (FIG. 1) removes the aligned wafer 2 from the aligner 41 and returns it to a wafer cassette 22 (FIG. 1). It is to be understood that as described for the operation of apparatus 25 of FIGS. 2-7E, the order of horizontal and vertical drive operating steps may be varied to achieve the same result as described above.

Figure 19A:
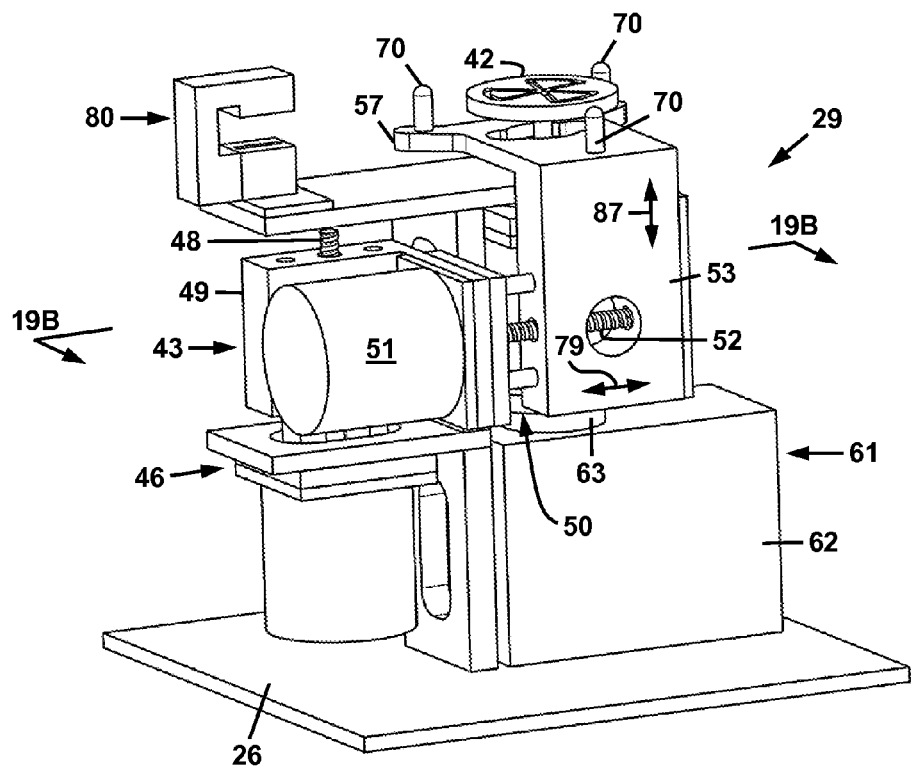
FIG. 19A is a perspective view of a third alternative wafer characterization apparatus comprising a rotation motor and chuck of a wafer aligner device disposed on a weigh scale.
Figure 19B:
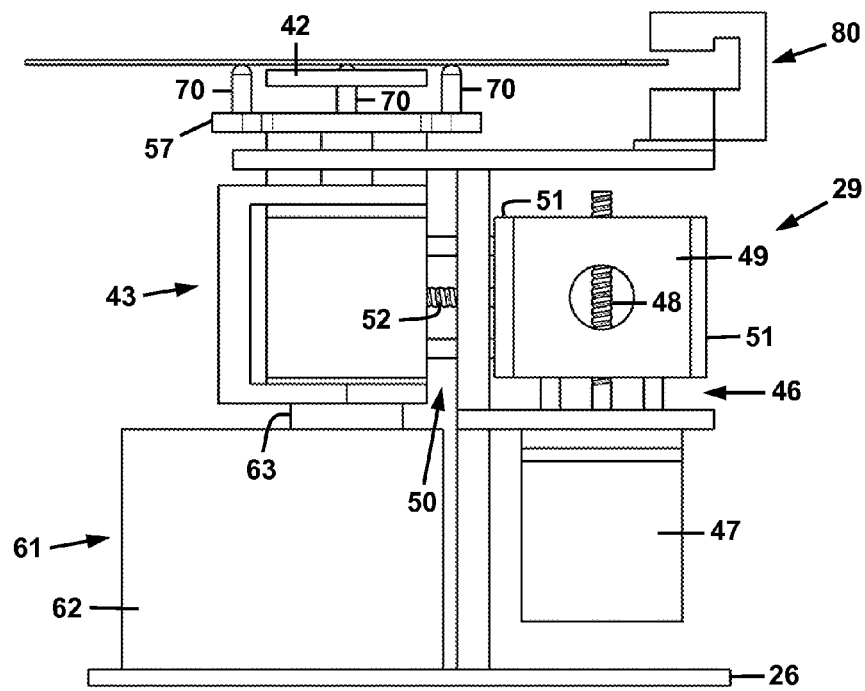
FIG. 19B is a side elevation view of the apparatus of FIG. 19A, taken along the line 19B-19B of FIG. 19A.

FIG. 19 A is a perspective view of another alternative wafer characterization apparatus in which a rotation motor and chuck of a wafer aligner device is disposed on a weigh scale; FIG. 19B is a side elevation view of the apparatus of FIG. 19A, taken along the line 19B-19B of FIG. 19A. The apparatus 29 is comprised of an aligner 43 and weighing scale 61, with functions as described for the apparatus 25 of FIGS. 2-6 and the apparatus 27 of FIGS. 18A and 18B. The aligner 43 and weighing scale 61 may be disposed upon a base plate 26, which may be made integrally with or mounted to a base similar to the base 18 of FIG. 1. The apparatus 29 of FIGS. 19A and 19B differs from the apparatus 27 of FIGS. 18A and 18B in that the aligner 43 of apparatus 29 is supported by the base plate 26, rather than by the weigh scale 61. However, the motor (not visible in FIGS. 19A and 19B, but similar to motor 44 of apparatus 27), which drives chuck 42, is disposed upon the weight bearing member 63 of the scale 61. Thus the chuck 42 and its drive motor are immobile. Instead, to align a wafer 2, the support member 57 including at least three support pins 70 is operatively connected to the aligner 43, so that a wafer 2 disposed upon pins 70 may be aligned with the chuck 42.

The aligner 43 of apparatus 29 is similar to the aligners 40 and 41 of apparatus 25 and 27, and is comprised of a first linear actuator 46 for displacing the support member 57 vertically as indicated by bidirectional arrow 87, and a second linear actuator 50 for displacing the support member 57 horizontally as indicated by bidirectional arrow 79. The first linear actuator 46 may be comprised of a first rotary motor 47, with a shaft driving a lead screw 48, which is engaged with a threaded drive block 49. In like manner, the second linear actuator 50 may be comprised of a second rotary motor 51, with a shaft driving a lead screw 52, which is engaged with a threaded drive block 53. As shown in FIG. 19A, the threaded drive block 53 and support 57 may be made as a single piece.

The weighing scale 61 is essentially as recited in apparatus 27 of FIGS. 18A and 18B, comprising a housing 62 containing a weighing sensor (not shown), and a weight bearing member 63 that is in communication within the weighing sensor.

The operation of the apparatus 29, in which a wafer is weighed, and aligned for further characterization steps such as imaging, is similar to the operation described previously for the apparatus 27 of FIGS. 18A and 18B. Referring again to FIGS. 19A and 19B, a robot (such as robot 12 of FIG. 1) places the wafer 2 onto the chuck 42, when the pins 70 and support member 57 are in the lowered position (as opposed to the raised position shown in FIGS. 19A and 19B). The wafer 2 may then be rotated by the chuck 42. A sensor 80 acquires wafer edge data during rotation as described previously herein for apparatus 25 of FIGS. 2-6. The wafer rotation is stopped at the point where the maximum wafer offset is parallel to the axis of the horizontal drive screw 52.

The vertical drive 46 is then operated to raise the support member 57 and pins 70 so that the wafer 2 is supported on the support pins 70, as shown in FIGS. 19A and 19B. The horizontal drive 50 is then operated to move the support member 57 and pins 70, thereby correcting the offset and centering the wafer 2 above the chuck 42 so that the center of rotation of the chuck 42 and the center of the wafer 2 are aligned. The vertical drive 46 is then operated to lower the wafer 2 and the chuck 42 so that the wafer 2 is supported on the chuck 42, and the pins 70 are no longer supporting the wafer. The centered wafer 2 may then be rotated to a desired angular position for another characterization step, such as wafer imaging.

At any time during these steps when the wafer 2 is supported by the rotatable chuck support 42, and preferably when no motion is occurring, the wafer weight may be measured. The tare weight of the chuck support and rotation motor assembly may be programmed into the weighing scale so that it is automatically subtracted out.

At the conclusion of the wafer weighing, alignment, and any other characterization steps, the robot 12 (FIG. 1) removes the aligned wafer 2 from the aligner 43 and scale 61 and returns it to a wafer cassette 22 (FIG. 1). It is to be understood that as described previously, the order of horizontal and vertical drive operating steps may be varied to achieve the same result as described above.

Other functional stations may be included in the Applicants' characterization apparatus. For example, the apparatus may include a wafer tilt wobble station (not shown), which includes a chuck that gimbals a wafer disposed thereupon using a joystick or other control device. Lighting may be directed onto the wafer from a source, in a manner that provides high contrast with any defects that are present. In one embodiment (not shown), the wobble station may be supported by a weigh scale. In operation, a wafer is placed on the chuck of the wobble station, and a weight measurement of the station and wafer is made. The weight of the station is known, and may be subtracted from any weight measurement to obtain the weight of the wafer; or the weigh scale may be provided with the tare weight of the station entered into the scale so the net wafer weight is measured.

Alternatively, a wafer cassette may be disposed on a weigh scale in a manner similar to the configuration shown in FIG. 11 and described previously herein. With the weight of the entire wafer cassette known, individual wafer weights may be obtained as wafers are added or removed from the cassette.

The wafer characterization apparatus 25 of FIGS. 2-11 may be used in an overall system for characterization and analysis of lots containing multiple wafers. The overall system further includes a computer in signal communication with the aligner 40, weighing scale 60, and imager 88 of the apparatus 25. The computer outputs signals for control of the aligner 40, weighing scale 60, and imager 88, and acquires data transmitted back from these devices. The computer stores the data in a memory. The computer is further comprised of a processor, which can execute algorithms stored in memory for analyzing the data, and for maintaining a database also stored in memory.

Figure 12:
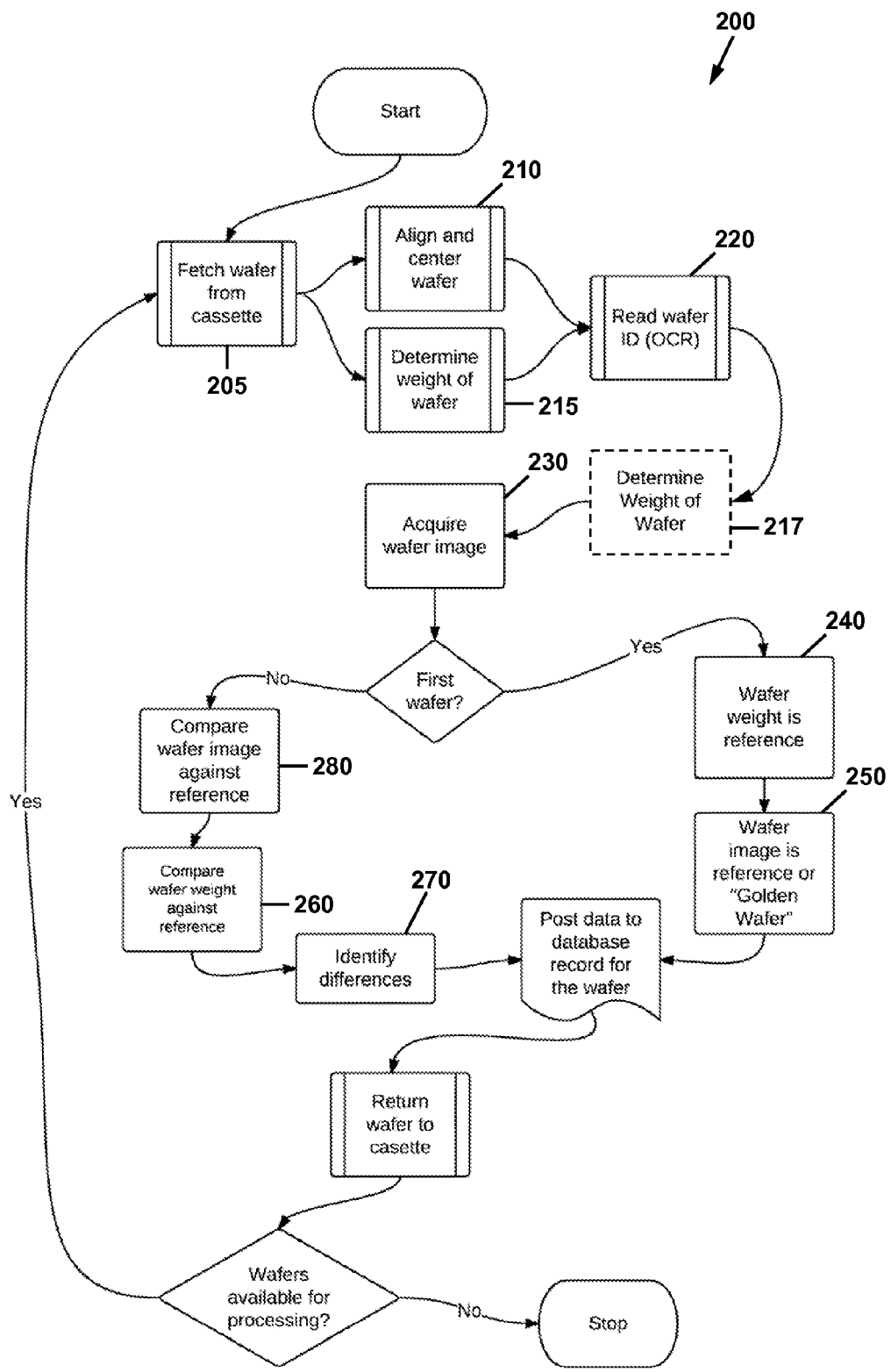
FIG. 12 is first flowchart depicting a method for characterizing a wafer or a set of multiple wafers.

FIG. 12 is a flowchart depicting a method 200 for characterizing a wafer or a set of multiple wafers using the Applicants' apparatus 25 and overall system. The Applicant's system and method 200 differs from prior processes by using a "less is more" approach to wafer measurements. The system and method 200 are designed to provide a simple pass/fail measurement with respect to a particular measured parameter. In order to achieve the pass/fail measurement, the system and method 200 avoids using weight measurements for absolute determinations. By avoiding the complexities of absolute determinations, the requirement for reference standards and critical parameter controls are effectively canceled out. Once the pass/fail measurement is made in accordance with the method 200, the determination and interpretation of the measurement data are left to the engineer/operator of the system. In practice, this technique is very powerful for manufacturing process control.

In addition to the in-process wafer analysis, as the wafers are processed, the Applicants' system creates a database with images and results for each individual wafer. The database is a permanent record that enables process engineers to communicate, review, and examine each wafer via a computer communications network. When the system is used to collect the image data before and after each process step it becomes a very powerful means to review and identify wafer process integrity. The careful recording of all the data enables the Applicants' system to measure and monitor each process step with identical analysis.

The potential power of this system becomes apparent when defect/failure analysis requires historical review of the wafer and end product process. For example, consider a situation where semiconductor chips are made from finished wafers, and where, after fabrication, an individual chip is identified as defective. Using the database generated by the Applicants' system, an engineer can find that exact location on a wafer, and then visualize and replay each step of the process from his desk. As he looks back through the process history, he can identify the source of the defect—possibly a particle, a scratch, or any number of other problems.

The same principle applies to defects for batches or lots of products. For example; if a lot of parts have suddenly tested near or out of tolerance, the Applicants' system can be used to examine the wafer or wafers for wafer-level symptoms. Once a particular process step is identified as causing the problem, the information can be fed back into the process to correct the problem.

A basic premise of the Applicants' system and method 200 is to provide a simple means to achieve a process measurement result without complex computation or setup. Alternative systems that strive to provide absolute determinations are prone to tolerance variances and/or calibration issues, with many more dependent variables. In contrast, the Applicants' system and method 200 are self-calibrating and self-referencing.

By way of illustration, and not limitation, consider that the effect on wafer weight by the different fabrication processes is a complicated matrix of process type, film parameters, and other variations. In order to make a useful absolute measurement of the film or process step, precise parameters such as the density of the film material would be required. As a consequence, the integration of wafer weight determination as a means for control of absolute characteristics becomes difficult.

The Applicants' method 200 utilizes differential comparison to provide high resolution determinations with a high degree of confidence, without the need for strict parameter control. Referring to FIG. 12, the method 200 is applicable to any fabrication process step which affects the wafers. In steps 205-230, the first wafer in each lot of wafers is characterized each time the wafer is inspected. The characterization may include the concurrent aligning and centering 210 of the wafer on the aligner 40, and determining 215 the weight of the wafer by the weighing scales 60; reading 220 the wafer identification number or code using a sensor and optical character recognition (OCR) or barcode or other code reading software; and acquiring 230 an image of the wafer, as described previously herein. These steps may be done in a different order. For example, it is not necessary that the aligning and centering 210 of the wafer be done in parallel with determining 215 the weight of the wafer. The aligning and centering 210 may be done, followed by reading 220 the wafer ID number, followed by determining 217 the weight of the wafer (shown in dotted line).

For the first wafer of the lot, the weight change (i.e., the difference between the post-process step wafer weight and the pre-process step wafer weight) is recorded, and this value is defined 240 as a reference value. Each subsequent wafer in the lot has its weight measured before and after the wafer processing step as well. The post/pre-process difference in weight of each wafer is compared 260 to the post/pre-process difference in weight for the reference wafer. The differences are identified 270 and a simple tolerance computation determines if the wafer should be flagged for re-examination. The wafer image may also be compared 280 to the reference image.

Additionally, for the first wafer of the lot, the post-process step wafer image acquired in step 230 is defined 250 as a reference or "golden wafer" image. The image for each subsequent wafer in the lot is compared to this image. This part of the process does not compute the difference between pre- or post-wafer processing.

The method 200 uses a unique algorithm that gleans important information from the wafer weight without the need for complex parameters sets that describe the wafer, film, and process step. Since each wafer is characterized before and after each process step, the Applicants' system can record the relative increase or decrease for each individual wafer. Furthermore, the algorithm incorporates the weight change of the standard "golden wafer" as well, as follows:

$$ProcessWeight = \text{weight of wafer pre-process} - \text{weight of wafer post process}$$

and $$Weight\ Determination = ProcessWeight_{first\ wafer} - ProcessWeight_{current\ wafer}$$

Once the result is determined, the process software will flag the wafer for reexamination based on pre-determined tolerances. The unique component of the weight analysis is the ability of the Applicants' system to compare changes to the target wafer with changes to the reference wafer. This yields meaningful results for any process step without the need for any information about the actual film or process. This principle is illustrated generally in FIG. 14.

TABLE 1

Hypothetical sample wafer data to which the algorithm may be applied.

| Wafer Num | Wafer Weight (grams) | | Change in Weight | Change from Reference |
|---|---|---|---|---|
| | Before Process | Post Process | | |
| 1 | 50.079 | 55.010 | 4.931 | "Golden Wafer" |
| 2 | 50.084 | 55.022 | 4.937 | 0.006 |
| 3 | 50.075 | 55.048 | 4.973 | 0.041 |
| 4 | 50.094 | 55.161 | 5.067 | 0.136 |
| 5 | 50.046 | 55.019 | 4.973 | 0.042 |
| 6 | 50.024 | 55.026 | 5.002 | 0.071 |

The method 200 may also be illustrated with reference to TABLE 1, which contains a hypothetical set of wafer data. In the sample data of TABLE 1, there are 6 wafers. Wafer 1 has been arbitrarily selected as the "golden wafer". The "golden wafer" reference could have just as easily have been one of the other wafers. TABLE 1 shows wafer weight data before and after a particular process step. The change in weight is computed and shown. The last column shows the change in weight relative to the reference or "Golden Wafer," i.e., wafer 1. From the data one can see that depending upon the allowable tolerance some of the wafers can be flagged for review, rejection or rework. If a tolerance of 0.050 were set, then wafer 4 and 6 would be flagged.

In practice, applying the above formulae with general parameters to the wafer weight in order to arrive at a conclusion will not always provide a satisfactory result. The difficulty is that the weight tolerance is different for varying wafer fabrication process steps. Thicker films coated on the wafer will be heavier, and thinner layers will be lighter. Accordingly, the tolerance range varies between these types of layers, and how the weight change relates to the physical change in wafer properties and the process step. In order to address this problem, the tolerance can be expressed in terms of a factor or a percent error. In practice, the percentage tolerance will not apply universally either.

Figure 13:
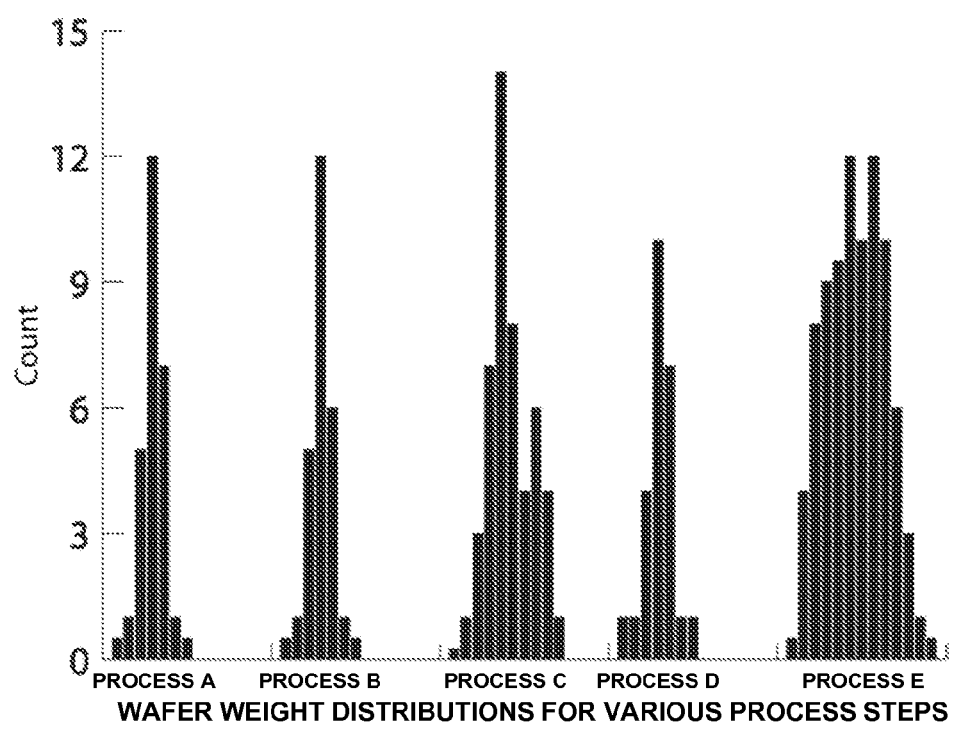
FIG. 13 is a set of bar graphs of weight distributions for various wafer fabrication process steps.

The Applicants have discovered that in the process of wafer fabrication, the change in wafer weight is analogous to a "fingerprint" of the process. For a given change in wafer weight, a particular process step can be identified. The Applicants' system and method 200 applies this characteristic to create a table of weight bins, as depicted in FIG. 13 for a series of wafer fabrication process steps A-E. This scheme of ranging or binning the wafer weight change in effect provides a means to apply the correct parameters to each measurement without requiring complicated recipes for each wafer. As each weight result is determined using the pre/post process algorithm previously described, the tolerance parameter is determined by this result. For example, using the histograms in FIG. 13, comparing the width of the weight bins shows that the acceptable tolerance for a weight result that falls in the range for PROCESS B would be less than for a weight result that falls in the range for PROCESS E. Accordingly, the Applicants' system and method 200 become self-referencing and self-calibrating.

Utilizing a wafer weight binning lot analysis scheme with the instant wafer weight measurement apparatus, a very simple system may be created without the need for wafer alignment or the use of an integrated wafer ID reader. Such a system may be used in performing analyses of weight measurements made before and after various film deposition, patterning, and etching process steps that are commonly performed on wafer substrates. Advantages of such a system are lower cost, less wafer handling, and higher throughput.

Either of two schemes may be used in the weight analysis. The first scheme, depicted in FIG. 20, is a wafer by wafer scheme that tracks each wafer and compares the weight against a reference or "golden wafer." The second scheme, depicted in FIG. 21, uses the mean weight of the lot as a reference.

Figure 20:
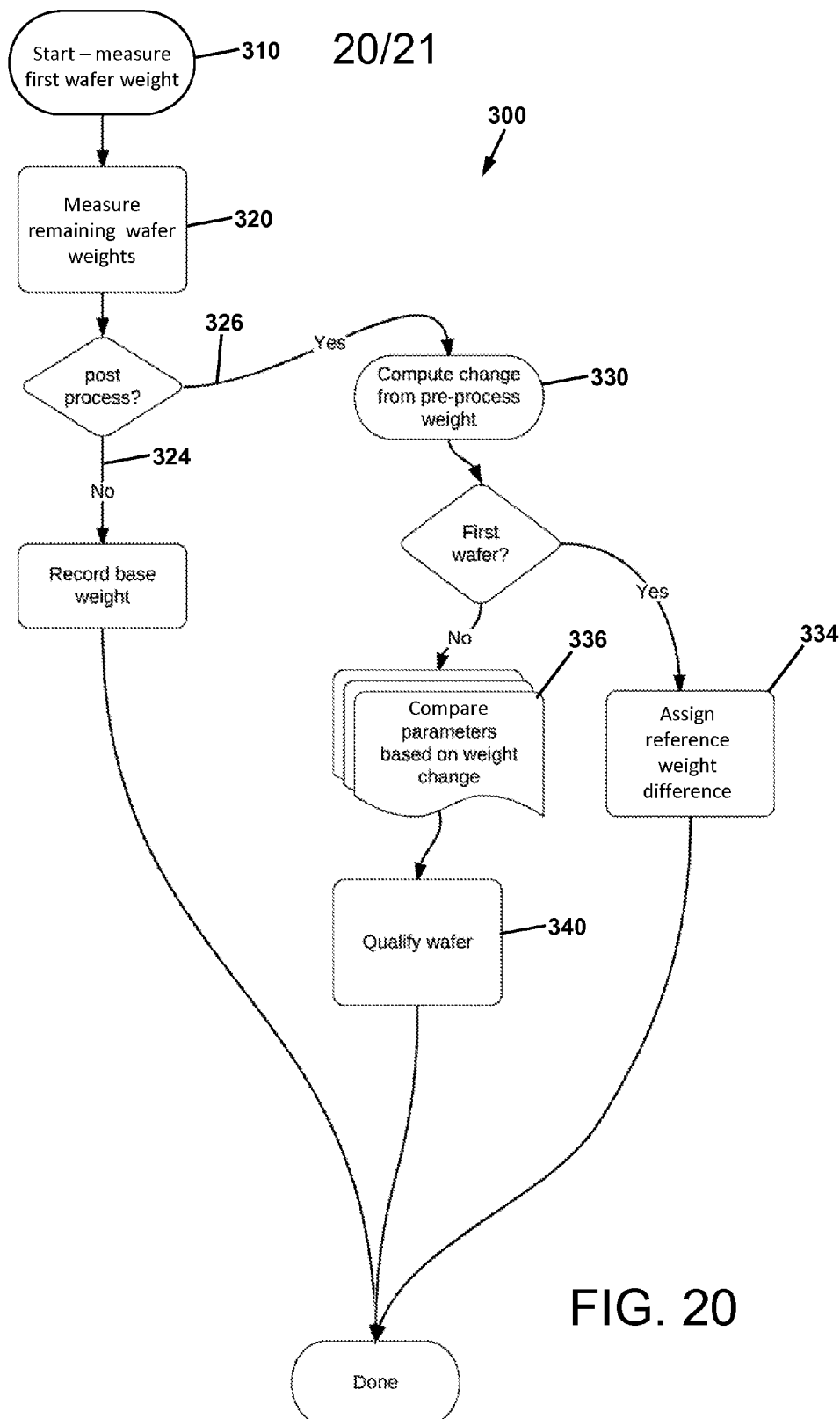
FIG. 20 is a third flowchart depicting a first wafer weight binning lot analysis scheme that may be practiced with the instant wafer weight measurement apparatus.

Referring first to FIG. 20, for a given process step (coating, patterning, etching, etc.), the first wafer scheme 300 starts by measuring 310 the first wafer, or "golden wafer," before 324 and after 326 the process step. (It is to be understood that the terms "first wafer," "reference wafer," and "golden wafer" terms used in this description refer to the practice of using data from a particular wafer as the basis of comparison of data from other wafers.) The difference between the post- and pre-step weights is computed 330 and becomes the reference difference assigned 334 to the first wafer. Each wafer in the lot is subsequently weighed 320 before 324 and after 326 each process step, and the difference between the post- and pre-step weights is computed 330. For any given wafer that follows the first wafer, the difference between the post- and pre-step weights is compared 336 against the reference weight difference 334. If the difference between the post- and pre-step weights is within a pre-determined tolerance range from above and below the reference difference assigned 334 to the first wafer, the wafer under consideration is qualified 340 to continue to the next step in the process. Deviation beyond the pre-determined tolerance will be used to flag an error condition based on these comparison criteria, in which case the wafer will not continue to the next step in the process. The out-of-spec wafer may be discarded and/or further tested, imaged, or inspected to understand the cause of the variance beyond the tolerance. It is noted that this scheme relies on the assumption that the first ("golden") wafer will always be present in the lot as the lot progresses through the various steps in the process. The reference or "golden" wafer does not necessarily need to be the first wafer. If it happens to be missing either due to a split lot, damage, or rework, then a different wafer can be used as the reference since the raw data collected for each wafer is the same.

Figure 21:
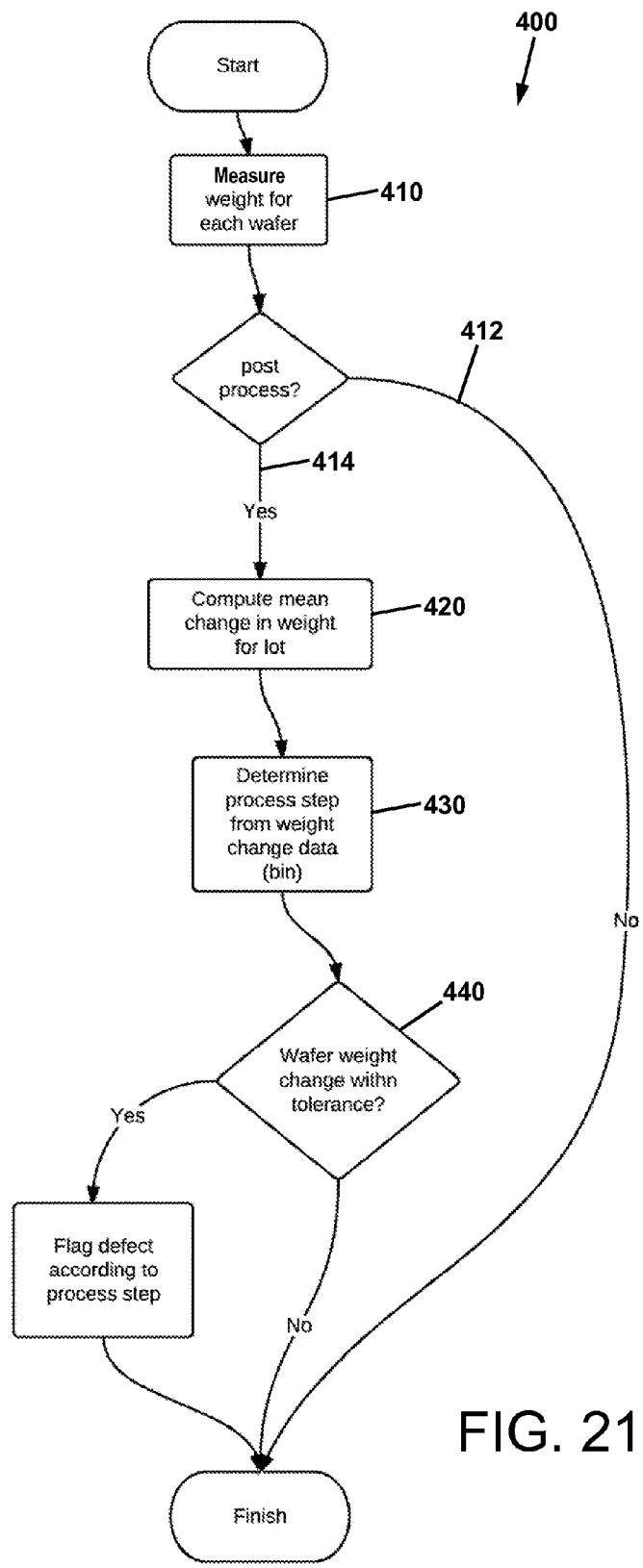
FIG. 21 is a fourth flowchart depicting a second wafer weight binning lot analysis scheme that may be practiced with the instant wafer weight measurement apparatus.

Referring now to FIG. 21, the second wafer weight reference scheme 400 is comprised of a lot analysis. In the lot analysis, the weight of each wafer in the lot is measured 410 before 412 and after 414 the process step. Once the measurements are complete, the difference between the mean weight before and the mean weight after the process is computed 420. To improve the data consistency, any points that statistically fall out a defined tolerance range may be ignored in the reference computation. By correlating the mean weight change data and the database of weight bins, the system can determine 430 the wafer process step with a reasonable amount of certainty. Determination of the process step is in itself an additional data point for process control. If the system identifies an out of sequence process step, the error is identified and corrective action can be performed to rework or reject the wafer. Additionally, the determination of the process step allows acceptance criteria to be used based on that particular process step.

Once the process step is known, the change in weight of each individual wafer is compared against the bin values. This final comparison 440 determines a pass/fail code for each wafer that contains relevant information about the deviation determined from the process step and error magnitude. This scheme 400 is much more flexible and robust in that knowledge of the individual wafer number is not required to produce an accurate determination of its acceptability.

The weight data for each wafer and process step is recorded as well as the reference weight for the qualification. This information may be linked in the database with the wafer imaging and manufacturing data to provide a complete record of the wafer history throughout the manufacturing of the wafer and products resulting from it.

Figure 14:
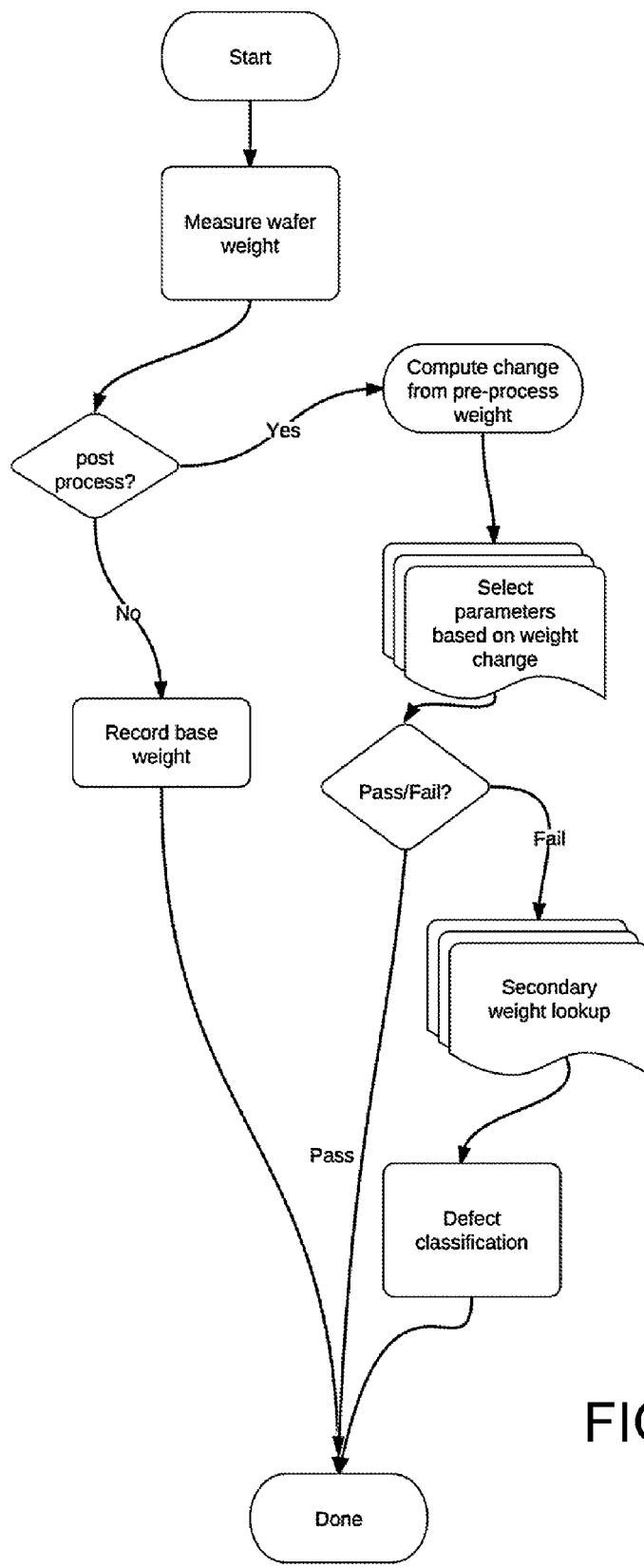
FIG. 14 is a second flowchart depicting the determination of acceptable wafers based upon the difference between pre-fabrication step weight and post-fabrication step weight.

The basic weight measurement algorithm previously described with reference to FIGS. 12-14 is also applicable to the above description of wafer weight and pre- and post-process change in weight. The weight value is the change in the difference for each wafer. The instant system compares the wafer weight before and after processing to arrive at a weight change value. Each wafer that is examined has a weight change. This alone does not represent much value as discussed previously, due to the possibility of variance in physical and environmental variables. However, when the change in weight is compared with the change in weight of a reference, the process variables cancel out, and the result is reliable data that is a sensitive indicator of wafer process control.

The wafer weight data may be correlated with other wafer physical properties or information. As each wafer passes through the Applicants' wafer characterization system, wafer edge data may be acquired along with the image and weight information. Based on the wafer weight, the characterization system can analyze additional information to help classify a given wafer. The weight data alone, as described previously, may not be reliable without strict environmental and physical control. However, using the weight change binning scheme disclosed herein, correlation and classification of wafer physical anomalies can be determined.

It is, therefore, apparent that there have been provided, in accordance with the present invention, apparatus and methods for characterization of wafers and other objects. Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims.

We claim:

1. A method for characterizing a lot of wafers following a first device fabrication process step performed on the wafers, the method comprising:
   a) prior to the process step, weighing a first reference wafer selected from the lot of wafers to obtain a pre-step reference weight;
   b) following the process step, weighing the first reference wafer to obtain a post-step reference weight;

c) subtracting the pre-step reference weight from the post-step reference weight to define a pre/post reference weight;

d) prior to the process step, weighing another wafer selected from the lot of wafers and defined as a test wafer to obtain a pre-step weight;

e) following the process step, weighing the test wafer to obtain a post-step weight;

f) subtracting the pre-step weight from the post-step weight to obtain a pre/post test weight of the test wafer;

g) comparing the pre/post reference weight of the reference wafer with the pre/post test weight of the test wafer;

h) if the pre/post test weight of the test wafer is within a pre-determined tolerance range for the first process step extending from above and below the pre/post reference weight of the reference wafer, delivering the test wafer to a subsequent device fabrication process step; and i) if the pre/post test weight of the test wafer is outside of the pre-determined tolerance range for the first process step extending from above and below the pre/post reference weight of the reference wafer, performing at least one of imaging the test wafer, inspecting the test wafer, performing a further test of the test wafer, or discarding the test wafer.

2. The method of claim 1, further comprising, for each of the remaining wafers in the lot, performing the steps of prior to the process step, weighing that wafer to obtain a pre-step weight of that wafer; following the process step, weighing that wafer to obtain a post-step weight; subtracting the pre-step weight from the post-step weight to obtain a pre/post test weight of that wafer; comparing the pre/post reference weight of the reference wafer with the pre/post process test weight of that wafer; if the pre/post process test weight of that wafer is within the pre-determined tolerance range for the first process step, delivering that wafer to the subsequent device fabrication process step; and if the pre/post process test weight of that wafer is outside of the pre-determined tolerance range for the first process step, performing at least one of imaging that wafer, inspecting that wafer, performing the further test of that wafer, or discarding that wafer.

3. The method of claim 1, wherein the first and subsequent device fabrication process steps are performed subsequent to at least one initial device fabrication process step.

4. The method of claim 3, wherein the first and subsequent device fabrication process steps are separated by at least one intermediate device fabrication process step.

5. The method of claim 1, wherein the first and subsequent device fabrication process steps are separated by at least one intermediate device fabrication process step.

\* \* \* \* \*